US010082550B2

(12) United States Patent
Tadic et al.

(10) Patent No.: US 10,082,550 B2
(45) Date of Patent: Sep. 25, 2018

(54) METHOD AND APPARATUS FOR THE MEASUREMENT, CHARACTERIZATION AND CORRECTION OF GEOMETRIC DISTORTIONS IN MAGNETIC RESONANCE IMAGING

(71) Applicant: University Health Network, Toronto (CA)

(72) Inventors: Tony Tadic, Toronto (CA); Teodor Marius Stanescu, Toronto (CA)

(73) Assignee: University Health Network, Toronto (CA)

( * ) Notice: Subject to any disclaimer, the term of this patent is extended or adjusted under 35 U.S.C. 154(b) by 0 days.

(21) Appl. No.: 15/850,931

(22) Filed: Dec. 21, 2017

(65) Prior Publication Data

US 2018/0136295 A1    May 17, 2018

Related U.S. Application Data

(63) Continuation of application No. 14/212,662, filed on Mar. 14, 2014, now Pat. No. 9,857,443.

(60) Provisional application No. 61/787,898, filed on Mar. 15, 2013.

(51) Int. Cl.
*G01V 3/00* (2006.01)
*G01R 33/387* (2006.01)
*G01R 33/565* (2006.01)
*G01R 33/58* (2006.01)
*G01R 33/48* (2006.01)

(52) U.S. Cl.
CPC ..... *G01R 33/387* (2013.01); *G01R 33/56572* (2013.01); *G01R 33/58* (2013.01); *G01R 33/4808* (2013.01)

(58) Field of Classification Search
CPC .................................................. G01R 33/56572
USPC ................................. 324/309, 307, 314, 300
See application file for complete search history.

(56) References Cited

U.S. PATENT DOCUMENTS

| 5,005,578 | A  | 4/1991  | Greer et al.   |
|-----------|----|---------|----------------|
| 6,445,182 | B1 | 9/2002  | Dean et al.    |
| 6,501,273 | B2 | 12/2002 | Krieg et al.   |
| 7,088,099 | B2 | 8/2006  | Doddrell et al.|
| 7,330,026 | B2 | 2/2008  | Wang et al.    |

(Continued)

OTHER PUBLICATIONS

Chen, et al., "Dosimetric evaluation of MRI-based treatment planning for prostate cancer", Phys Med Biol, 2004, 49 (22): 5157-70.

(Continued)

*Primary Examiner* — Louis Arana
(74) *Attorney, Agent, or Firm* — Bereskin & Parr LLP/S.E.N.C.R.L., s.r.l.; Tony Orsi

(57) ABSTRACT

Various embodiments are described herein for an apparatus and a method for measuring and characterizing geometric distortions for a region of interest in images obtained using magnetic resonance. The method comprises deriving a computed set of 3D distortion vectors for a set of points within a region of interest covered by a phantom by using harmonic analysis to solve an associated boundary value problem based on boundary conditions derived from a measured set of 3D distortion vectors. The characterized image distortions may be used for various purposes such as for image correction or for shimming, for example.

17 Claims, 15 Drawing Sheets

(56) References Cited

U.S. PATENT DOCUMENTS

| | | | | |
|---|---|---|---|---|
| 7,535,227 | B1* | 5/2009 | Koch | G01R 33/5616 324/307 |
| 7,772,843 | B2* | 8/2010 | Hebrank | G01R 33/56518 324/309 |
| 9,857,443 | B2* | 1/2018 | Tadic | G01R 33/387 |
| 2004/0113615 | A1* | 6/2004 | Bammer | G01R 33/56341 324/307 |
| 2015/0088449 | A1* | 3/2015 | Foxall | A61B 6/583 702/104 |
| 2015/0309149 | A1* | 10/2015 | Holdsworth | G01R 33/58 324/309 |

OTHER PUBLICATIONS

Lambert, et al., "MRI-guided prostate radiation therapy planning: Investigation of dosimetric accuracy of MRI-based dose planning", Radiother Oncol, 2011, 98(3): 330-4.

Wang, et al., "Geometric distortion in clinical MRI systems Part I: evaluation using a 3D phantom", Magn Reson Imaging, 2004, 22(9): 1211-21.

Doran, et al., "A complete distortion correction for MR images: I. Gradient warp correction", Phys Med Biol, 2005, 50 (7): 1343-61.

Stanescu, et al., "Investigation of a 3D system distortion correction method for MR images", J Appl Clin Med Phys, 2010, 11(1): 200-16.

Stanescu, K., et al., "Characterization of tissue magnetic susceptibility-induced distortions for MRIgRT", Med Phys, 2012, 39(12): 7185-93.

Wang, et al., "Geometric distortion in clinical MRI systems Part II: correction using a 3D phantom", Magn Reson Imaging, 2004, 22(9): 1223-32.

Baldwin, et al., "Characterization, prediction, and correction of geometric distortion in 3 T MR images", Med Phys, 2007, 34(2): 388-99.

Sumanaweera, et al., "Characterization of spatial distortion in magnetic resonance imaging and its implications for stereotactic surgery", Neurosurgery, 1994, 35(4): 696-703; discussion 703-4.

Fallone, et al., "First MR images obtained during megavoltage photon irradiation from a prototype integrated linac-MR system", Med Phys, 2009, 36(6): 2084-8.

Raaijmakers, et al., "Integrating a MRI scanner with a 6 MV radiotherapy accelerator: dose increase at tissue-air interfaces in a lateral magnetic field due to returning electrons", Phys Med Biol, 2005, 50(7): 363-76.

Tadic, et al., "MRIgRT facility design: magnetic field decoupling of an MRI-on-rails from a linear accelerator", 5th NCIGT and NIH Image Guided Therapy Workshop, 2012.

Tanner, et al., "Radiotherapy planning of the pelvis using distortion corrected MR images: the removal of system distortions", Phys Med Biol, 2000, 45: 2117-32.

Holden, et al., "Sources and correction of higher order geometrical distortion for serial MR brain imaging", Proceedings of SPIE, 2001, 4322: 69-78.

Breeuwer, et al., "Detection and correction of geometric distortion in 3D MR images", Proceedings of SPIE Medical Imaging, 2001, 4322: 1110-20.

Krempien, et al., "Open low-field magnetic resonance imaging in radiation therapy treatment planning", Int. J. Radiation Oncology Biol. Phys, 2002, 53(5): 1350-60.

Mizowaki, et al., "Reproducibility of geometric distortion in magnetic resonance imaging based on phantom studies", Radiotherapy and Oncology, 2000, 57: 237-42.

Karger, et al., "Accuracy of device-specific 2D and 3D image distortion correction algorithms for magnetic resonance imaging of the head provided by a manufacturer", Phys. Med. Biol, 2006, 51: N253-61.

Janke, et al., "Use of Spherical Harmonic Deconvolution Methods to Compensate for Nonlinear Gradient Effects on MRI Images", Magnetic Resonance in Medicine, 2004, 52: 115-22.

Jovicich, et al., "Reliability in multi-site structural MRI studies: Effects of gradient non-linearity correction on phantom and human data", NeuroImage, 2006, 30: 436-43.

Stroud, "Approximate Calculation of Multiple Integrals", 1971, New Jersey: Prentice-Hall, pp. 23-52.

Jackson, "Classical Electrodynamics", 3rd Ed., 1998: Wiley, pp. 95-111.

Lebedev, et al., "A quadrature formula for the sphere of the 131st algebraic order of accuracy", Doklady Mathematics, 1999, 59(3): 477-81.

* cited by examiner

METHOD AND APPARATUS FOR THE MEASUREMENT, CHARACTERIZATION AND CORRECTION OF GEOMETRIC DISTORTIONS IN MAGNETIC RESONANCE IMAGING

CROSS-REFERENCE TO RELATED APPLICATIONS

This application is a continuation of U.S. Non-Provisional patent application Ser. No. 14/212,662, filed on Mar. 14, 2014 which has issued to U.S. Pat. No. 9,857,443 on Jan. 2, 2018 and claims priority to U.S. Provisional Patent Application No. 61/787,898, filed Mar. 15, 2013. The entire contents of U.S. Provisional Patent Application No. 61/787,898 and U.S. Pat. No. 9,857,443 is hereby incorporated by reference.

FIELD

The various embodiments described herein generally relate to a method and apparatus for the measurement, characterization, and correction of geometric distortions encountered in MRI and NMR.

BACKGROUND

Magnetic Resonance Imaging (MRI) is emerging as the modality of choice for soft-tissue tumor visualization in image-guided therapeutic procedures such as surgery, mild therapeutic hyperthermia, high-intensity focused ultrasound (HIFU), microbubble radiosensitization, and most notably, radiation therapy for the treatment of cancer. This is due to its superior soft-tissue image contrast compared to other mainstream imaging modalities such as ultrasound (US) and x-ray based imaging, i.e. computed tomography (CT) and cone beam CT (CBCT). Radiation therapy, which aims to kill cancerous tumors by delivering high doses of radiation with high accuracy (1-2 mm), relies heavily on imaging for patient diagnosis and daily treatment setup verification. In spite of MRI's flexibility in providing multiple contrast mechanisms (e.g., T1/T2-weighted imaging) and multiplanar acquisition modes, MRI's use is limited, being typically relied upon only as an additional (sometimes elective) imaging session to complement CT-derived data. The main reasons for this are that MR images lack information regarding tissue electron densities (or CT numbers), which are required for treatment plan dose simulations and most important, MR images are intrinsically affected by geometric image distortions.

MR image distortions are commonly classified in two main categories: a) system or scanner related distortions due to inhomogeneities in the MR's main magnetic field and nonlinearities in the imaging gradients, and b) object or patient-induced distortions caused by local variations of tissue magnetic susceptibility properties and chemical shift effects. The system-related distortions are in the range of 1-2 cm over a large field of view (FOV), i.e. pelvis, and gradually increase in magnitude with distance from the MR's isocenter. In contrast, the magnitude of patient-induced distortions is less significant, i.e. in the range of a few mm, and localized at the interface between various anatomical structures.

MRI is expected to play an increasing role in radiation therapy with the advent of newly emerging MR-guided technologies such as MR-linac and MR-$^{60}$Co systems. MR-linac systems refer to the integration of an MR scanner with a therapy linear accelerator (linac) such that MR imaging is available in the therapy room. The current proposed MR-linac designs refer to a) coupled systems in which both the MR scanner and the linac are mounted on a single gantry to facilitate treatment delivery from any rotational angle and b) a proximity system in which the MR scanner is on-rails and travels in and out of the linac vault and can image at a predefined location in close proximity of the linac. Similar to the MR-linac systems, the MR-$^{60}$Co combines an MR scanner with three $^{60}$Co sources mounted on the same gantry (e.g. ViewRay, Oakwood Village, Ohio). The $^{60}$Co sources can rotate around the patient to deliver radiation from multiple positions.

For MRI-guided radiation therapy, MRI is expected to become the primary imaging modality for generating image data used for both treatment simulation and daily patient setup verification. Quantification and correction of image distortions is preferably done before the images are integrated into the treatment planning process. The MR images should exhibit a spatial accuracy similar to CT. Uncorrected geometric errors are likely to reduce the accuracy of the treatment plan simulation and delivery, which ultimately leads to poor patient treatment outcomes.

SUMMARY OF VARIOUS EMBODIMENTS

In a broad aspect, at least one embodiment described herein provides a method for the measurement and characterization of geometric distortions in images obtained using magnetic resonance. The method comprises acquiring image data from an MR scan of a phantom using an imaging protocol, the phantom being placed to cover a volume or region of interest (ROI) requiring quantification of geometric distortion; identifying spatial locations of control points associated with at least a portion of the phantom; registering the located control points to a reference template of the phantom; determining a measured set of 3D distortion vectors for the located control points of the phantom using the reference template; and deriving a computed set of 3D distortion vectors from the measured set of 3D distortion vectors for a set of points within a region of interest covered by the phantom by using harmonic analysis.

In at least some embodiments, the method further comprises performing image correction using a 3D distortion field comprising the computed set of 3D distortion vectors.

In at least some embodiments, the method further comprises performing at least one additional MR scan of the phantom to separate the 3D distortion field into contributions from a static polarizing field and magnetic field gradients.

In at least some embodiments, the reference template can be generated from manufacturing specifications of the phantom or by imaging the phantom with a distortion-free modality.

In at least some embodiments, the 3D distortion field may generally be defined as a difference between the MR located control points and corresponding template coordinates of each located control point.

In at least some embodiments, the harmonic analysis comprises interpolating the measured set of 3D distortion vectors measured at the control points of the phantom to quadrature nodes; computing expansion coefficients for selected harmonic basis functions using an inner product formula for each of three spatial components of the 3D distortion field; and computing three components of the computed set of 3D distortion vectors at a collection of points within the region of interest according to a harmonic expansion summation formula.

In some cases, the harmonic expansion summation can be a truncated harmonic expansion summation.

In at least some embodiments, the geometry of sub-portions of the phantom containing the control points dictates the choice of orthogonal basis functions used to determine the harmonic expansion coefficients.

In at least some embodiments, the harmonic analysis comprises determining a harmonic representation of the 3D distortion field by solving Laplace's equation using a numerical technique for solving second-order boundary value problems with arbitrary boundary geometries.

In at least some embodiments, the method further comprises computing distortion analytics for quantifying the 3D distortion field globally.

In at least some embodiments, the method further comprises computing distortion analytics for quantifying the 3D distortion field locally.

In at least some embodiments, the method further comprises performing a validation test to verify the 3D distortion field determined using the harmonic analysis by measuring residual distortion values for a known geometry.

In at least some embodiments, the known geometry is obtained using a phantom insert placed inside a region of the phantom that is absent of any control points.

In at least some embodiments, the phantom comprises one of a sphere, a cylinder, a cuboid or an irregularly shaped structure and control points associated with the phantom.

In at least some embodiments, the phantom has a relatively thin shell and the control points comprise cavities filled with contrast material comprising one of, but not limited to, water, copper sulphate solution and mineral oil and the shell comprises one of plastic, perspex, acrylic and polyurethane, for example.

In at least some embodiments, the phantom has a relatively thin shell and the control points comprise solid markers comprising one of, but not limited to, plastic, perspex, acrylic, and polyurethane surrounded by a bath of contrast material comprising one of water, copper sulphate solution, and mineral oil, for example.

In at least some embodiments, the phantom has a hollow space and comprises a removable phantom insert in the hollow space to provide at least one additional layer of control points on which harmonic analysis can be performed for data verification and redundancy.

In at least some embodiments, the phantom has a hollow space and comprises a removable phantom insert in the hollow space to test image quality of an MR scanner.

In at least some embodiments, the phantom has a hollow space and comprises a radiation dosimetry system in the hollow space.

In at least some embodiments, a hollow space within the phantom is used to house an image quality insert for other imaging modalities.

The other imaging modalities include, but are not limited to, x-ray, Ultrasound, Positron Emission Tomography (PET), High Intensity Focused Ultrasound (HIFU), and the like, for example.

In at least some embodiments, the method further comprises computing the 3D distributions of the static polarizing field or gradient magnetic fields using the harmonic representation of the 3D distortion field or the computed set of 3D distortion vectors derived from the harmonic analysis.

The 3D distributions of the static polarizing field or gradient magnetic fields may be used for a variety of purposes such as, but not limited to, shimming of the static polarizing field (which may involve the gradient fields themselves), monitoring the stability of a scanner's performance over time and determining the spatial location of the imaging gradients' isocenter.

In these embodiments, the method may further comprise performing image correction using the computed 3D distributions of the static polarizing field or the gradient magnetic fields to modify raw image data in the spatial frequency domain (i.e. in the k-space domain).

In at least some embodiments, the method comprises performing an iterative adjustment of one or more design parameters of an MR scanner to reduce the imaging distortion magnitude defined by the computed set of 3D distortion vectors or the parameters comprising the derived harmonic representation of the 3D distortion field.

In at least some embodiments, the design parameters comprise one or more of gradient coil position and gradient waveform pre-emphasis characteristics.

The control points may be located on at least a portion of an outer surface of the shell of the phantom, on at least a portion of an inner surface of the shell of the phantom, embedded within at least a portion of the shell of the phantom or embedded at other locations within the phantom.

In another aspect, at least one embodiment described herein provides a method for shimming an MR imaging field and adjusting a gradient system for an MR scanner. The method comprises acquiring image data from an MR scan of a phantom using at least one imaging protocol, the phantom being placed to cover a given imaging volume; identifying spatial locations of control points associated with at least a portion of the phantom; registering the located control points to a reference template of the phantom; determining a measured set of 3D distortion vectors for the located control points of the phantom using the reference template; deriving a harmonic representation of the 3D distortion field or a computed set of 3D distortion vectors from the measured set of 3D distortion vectors for a set of points within a region of interest covered by the phantom by using harmonic analysis; using a measure of the magnitude of the distortion field as an estimate of field homogeneity; adjusting at least one shim parameter if the field homogeneity of the imaging field is greater than a reference value and performing the acquiring, identifying, registering, determining, computing and adjusting acts; and completing the shimming of the MR imaging field when the field homogeneity of the imaging field is lower than the reference value.

In at least some embodiments, the shim parameters comprise at least one of shim coil current, shim coil position, location of ferromagnetic shim pieces, shape of ferromagnetic shim pieces, size of ferromagnetic shim pieces, and magnetic properties of ferromagnetic shim pieces.

In another aspect, at least one embodiment described herein provides a computer readable medium comprising a plurality of instructions that are executable on a microprocessor of a device for adapting the device to implement one of the methods described herein.

In another aspect, at least one embodiment described herein provides an operator unit for the measurement and characterization of geometric distortions in images obtained using magnetic resonance. The operator unit comprises an interface unit coupled to an imaging device to allow control signals to be sent to the imaging device and to receive data from the imaging device including imaging data; and a processing unit for controlling the operator unit and the imaging device and for determining geometric distortion in the image data received from the imaging device, the processing unit being configured to acquire image data from an MR scan of a phantom using an imaging protocol, the phantom being placed to cover a volume or ROI requiring quantification of geometric distortion; to identify spatial locations of control points associated with at least a portion of the phantom; to register the located control points to a reference template of the phantom; to determine a measured set of 3D distortion vectors for the located control points of the phantom using the reference template; and to derive a computed set of 3D distortion vectors from the measured set of 3D vectors for a set of points within a region of interest covered by the phantom by using harmonic analysis.

The processing unit is generally configured to perform any one of the image correction methods described herein.

In another aspect, at least one embodiment described herein provides an operator unit for shimming an MR imaging field and adjusting a gradient system for an MR scanner. The operator unit comprises an interface unit coupled to an imaging device to allow control signals to be sent to the imaging device and to receive data from the imaging device including imaging data; and a processing unit for controlling the operator unit and the imaging device, the processing unit being configured to acquire image data from an MR scan of a phantom using at least one imaging protocol, the phantom being placed to cover a given imaging volume; to identify spatial locations of control points associated with at least a portion of the phantom; to register the located control points to a reference template of the phantom; to determine a measured set of 3D distortion vectors for the located control points of the phantom using the reference template; to derive a harmonic representation of the 3D distortion field or a computed set of 3D distortion vectors from the measured set of 3D distortion vectors for a set of points within a region of interest covered by the phantom by using harmonic analysis; using a measure of the magnitude of the distortion field as an estimate of field homogeneity; to adjust at least one shim parameter if the field homogeneity of the imaging field is greater than a reference value and to perform the acquiring, identifying, registering, determining, computing and adjusting acts; and to complete the shimming of the MR imaging field when the field homogeneity of the imaging field is lower than the reference value.

In at least some embodiments, the processing unit is further configured to perform any of the shimming methods described herein.

Other features and advantages of the present application will become apparent from the following detailed description taken together with the accompanying drawings. It should be understood, however, that the detailed description and the specific examples, while indicating preferred embodiments of the application, are given by way of illustration only, since various changes and modifications within the spirit and scope of the application will become apparent to those skilled in the art from this detailed description.

BRIEF DESCRIPTION OF THE DRAWINGS

For a better understanding of the various embodiments described herein, and to show more clearly how these various embodiments may be carried into effect, reference will be made, by way of example, to the accompanying drawings which show at least one example embodiment, and which are now described.

Figure 1:
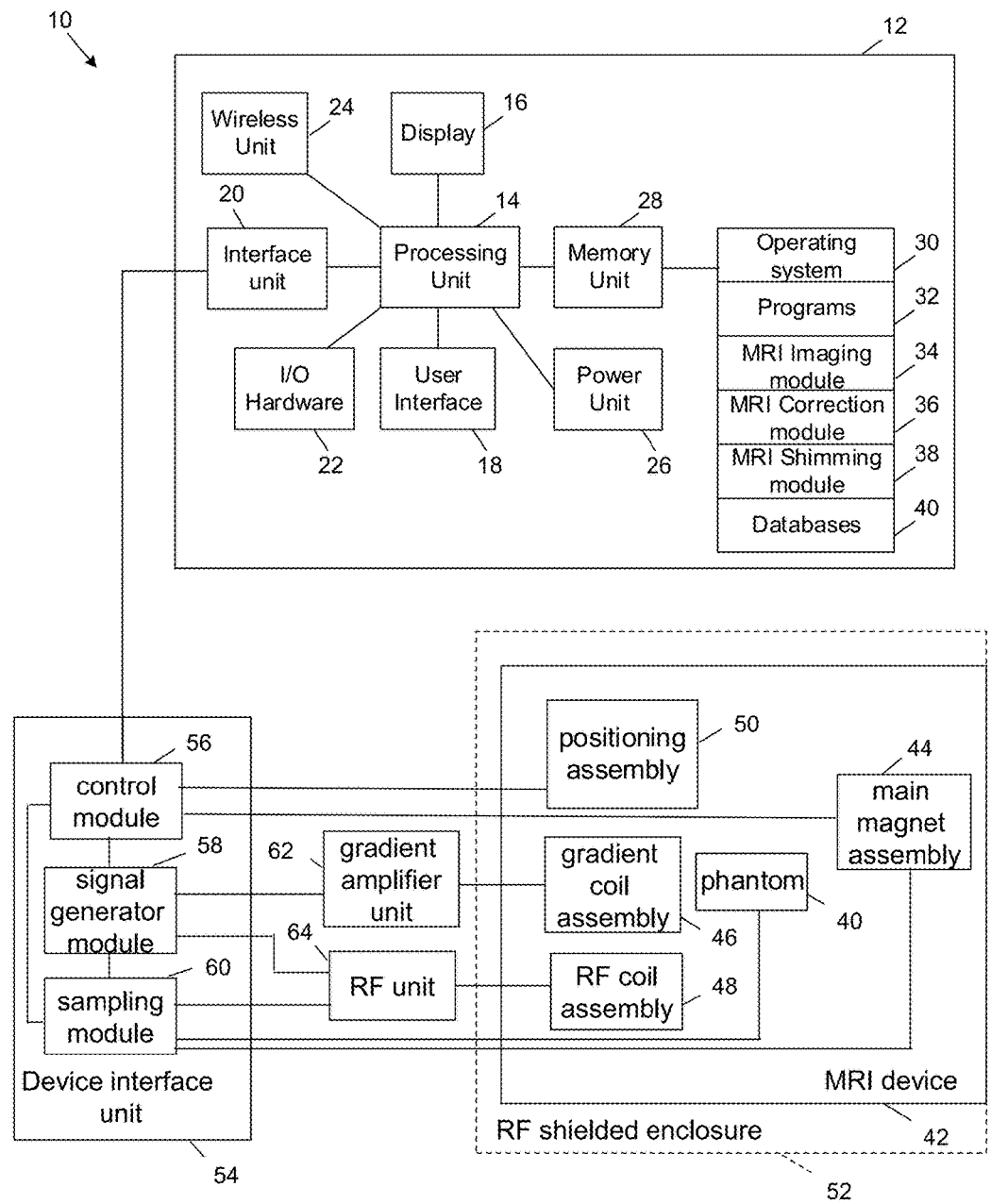
FIG. 1 is a block diagram of an example embodiment of an MRI system.

Further aspects and features of the embodiments described herein will appear from the following description taken together with the accompanying drawings.

DETAILED DESCRIPTION OF THE EMBODIMENTS

Various apparatuses or processes will be described below to provide an example of at least one embodiment of the claimed subject matter. No embodiment described below limits any claimed subject matter and any claimed subject matter may cover processes, apparatuses or systems that differ from those described below. The claimed subject matter is not limited to apparatuses, processes or systems having all of the features of any one apparatus, process or system described below or to features common to multiple or all of the apparatuses, or processes or systems described below. It is possible that an apparatus, process or system described below is not an embodiment of any claimed subject matter. Any subject matter that is disclosed in an apparatus, process or system described below that is not claimed in this document may be the subject matter of another protective instrument, for example, a continuing patent application, and the applicants, inventors or owners do not intend to abandon, disclaim or dedicate to the public any such subject matter by its disclosure in this document.

Furthermore, it will be appreciated that for simplicity and clarity of illustration, where considered appropriate, reference numerals may be repeated among the figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Also, the description is not to be considered as limiting the scope of the embodiments described herein.

It should also be noted that the terms "coupled" or "coupling" as used herein can have several different meanings depending in the context in which these terms are used. For example, the terms coupled or coupling can have a mechanical, electrical or magnetic connotation. For example, as used herein, the terms coupled or coupling can indicate that two elements or devices can be directly connected to one another or connected to one another through one or more intermediate elements or devices via an electrical element or electrical signal, a magnetic element or magnetic signal or a mechanical element depending on the particular context.

It should be noted that terms of degree such as "substantially", "about" and "approximately" as used herein mean a reasonable amount of deviation of the modified term such that the end result is not significantly changed. These terms of degree may be construed as including a certain deviation of the modified term if this deviation would not negate the meaning of the term it modifies.

Furthermore, the recitation of numerical ranges by endpoints herein includes all numbers and fractions subsumed within that range (e.g. 1 to 5 includes 1, 1.5, 2, 2.75, 3, 3.90, 4, and 5). It is also to be understood that all numbers and fractions thereof are presumed to be modified by the term "about" which means a variation up to a certain amount of the number to which reference is being made if the end result is not significantly changed.

As used herein, the wording "and/or" is intended to represent an inclusive-or. That is, "X and/or Y" is intended to mean X or Y or both, for example. As a further example, "X, Y, and/or Z" is intended to mean X or Y or Z or any combination thereof.

Furthermore, in the following passages, different aspects of the embodiments are defined in more detail. Each aspect so defined may be combined with any other aspect or aspects unless clearly indicated to the contrary. In particular, any feature indicated as being preferred or advantageous may be combined with at least one other feature or features indicated as being preferred or advantageous unless this combination would not be operable for its intended purpose.

Described herein are various example embodiments of an apparatus and method that can be used for the measurement, characterization, and correction of system-related geometric distortions in nuclear magnetic resonance (NMR) and magnetic resonance imaging (MRI). Such distortions may primarily result from inhomogeneities in the static polarizing magnetic field ($B_0$) and nonlinearities in the magnetic field imaging gradients. The embodiments described herein utilize a harmonic field description of the geometric distortions for a specified region of interest (ROI). This harmonic field description is taken as the solution of a second-order boundary value problem (BVP) comprised of Laplace's equation. The boundary conditions of this BVP are derived from measurements of the geometric distortion on the boundary of the ROI. These measurements may be obtained directly via image processing of MR images of a phantom possessing a known geometry. The harmonic field description of the geometric distortions may be used to construct a unique 3D distortion map (i.e. vector field) within the ROI, which aids in obtaining spatially more accurate MR images. It should be understood that the techniques described herein can apply to any NMR localization or imaging system employing magnetic field gradients.

In other words, for a given ROI in space (abstracted from the phantom itself), the distortion values on any simply connected surface (i.e. without holes or missing patches) that encapsulates the ROI can be used to reconstruct the distortion values within the ROI. Although, in general, knowledge of the distortion at every conceivable point on such an enclosing surface may be used to uniquely define the distortion at all points within the ROI, the values of the distortion at a discrete collection of points are usually sampled for practical reasons. The spatial distribution of these sampling points can vary and it is reasonable to conceive of a distribution that omits points on some sub-portion of the enclosing surface. Therefore, the control/sampling points need not be distributed across the entire surface of the phantom but along at least a portion of the surface of the phantom. This surface may coincide with the actual surface of a phantom or with a layer within the shell of the phantom or the inner surface of a phantom that is hollow.

Referring now to FIG. 1, shown therein is a block diagram of an example embodiment of an MRI system 10. The MRI system 10 includes an operator unit 12, a device interface unit 54 and an MRI device 42. The MRI system 10 is provided as an example and there can be other embodiments of an MRI system with different components or a different configuration of the components described herein. The MRI system 10 further includes several power supplies (not all shown) connected to various components of the MRI system 10 as is commonly known to those skilled in the art. A user interacts with the operator unit 12 to perform at least one of monitoring (i.e. quality assurance) of the image quality, calibration for image correction, shimming for parameter tuning and operational control when the MRI system 10 is being used in the field. In some cases, there may be other operations that may be performed as is known by those skilled in the art.

The operator unit 12 comprises a processing unit 14, a display 16, a user interface 18, an interface unit 20, Input/Output (I/O) hardware 22, a wireless unit 24, a power unit 26 and a memory unit 28. The memory unit 28 comprises software code for implementing an operating system 30, various programs 32, an MRI imaging module 34, an MRI correction module 36, an MRI shimming module 38 and one or more databases 40. Many components of the operator unit 12 can be implemented using a desktop computer, a laptop, a mobile device, a tablet, and the like.

The processing unit 14 controls the operation of the operator unit 12 and can be any suitable processor, controller or digital signal processor that can provide sufficient processing power processor depending on the configuration, purposes and requirements of the MRI system 10 as is known by those skilled in the art. For example, the processing unit 14 may be a high performance general processor. In alternative embodiments, the processing unit 14 can include more than one processor with each processor being configured to perform different dedicated tasks. In alternative embodiments, specialized hardware can be used to provide some of the functions provided by the processing unit 14.

The display 16 can be any suitable display that provides visual information depending on the configuration of the operator unit 12. For instance, the display 16 can be a cathode ray tube, a flat-screen monitor and the like if the operator unit 12 is a desktop computer. In other cases, the display 16 can be a display suitable for a laptop, tablet or handheld device such as an LCD-based display and the like.

The user interface 18 can include at least one of a mouse, a keyboard, a touch screen, a thumbwheel, a track-pad, a track-ball, a card-reader, voice recognition software and the like again depending on the particular implementation of the operator unit 12. In some cases, some of these components can be integrated with one another.

The interface unit 20 can be any interface that allows the operator unit 12 to communicate with other devices or computers. In some cases, the interface unit 20 can include at least one of a serial port, a parallel port or a USB port that provides USB connectivity. The interface unit 20 can also include at least one of an Internet, Local Area Network (LAN), Ethernet, Firewire, modem or digital subscriber line connection. Various combinations of these elements can be incorporated within the interface unit 20.

The I/O hardware 22 is optional and can include, but is not limited to, at least one of a microphone, a speaker and a printer, for example.

The wireless unit 24 is optional and can be a radio that communicates utilizing CDMA, GSM, GPRS or Bluetooth protocol according to standards such as IEEE 802.11a, 802.11b, 802.11g, or 802.11n. The wireless unit 24 can be used by the operator unit 12 to communicate with other devices or computers.

The power unit 26 can be any suitable power source that provides power to the operator unit 12 such as a power adaptor or a rechargeable battery pack depending on the implementation of the operator unit 12 as is known by those skilled in the art.

The memory unit 28 can include RAM, ROM, one or more hard drives, one or more flash drives or some other suitable data storage elements such as disk drives, etc. The memory unit 28 is used to store the operating system 30 and programs 32 as is commonly known by those skilled in the art. For instance, the operating system 30 provides various basic operational processes for the operator unit 12. The programs 32 include various user programs so that a user can interact with the operator unit 12 to perform various functions such as, but not limited to, viewing and manipulating data as well as sending messages as the case may be.

The MRI imaging module 34 is used to control the MRI device to obtain MR images of a subject, a phantom or some other object as is known by those skilled in the art.

The MRI correction module 36 may be used to measure, characterize, and correct system-related geometric distortions according to at least one of the various embodiments described herein. In at least some embodiments, the MRI correction module 36 may also be configured to perform Quality Assurance (QA) monitoring of the MR image quality. This may be done by using various phantom inserts. It should be noted that after computing the MR distortions, it may not be necessary to correct the MR images for some cases (e.g. for small fields of view) in which the magnitude of the distortion may be less than a pre-defined threshold (e.g. 1 mm or the pixel resolution). However, for these particular situations, the distortion field data may still be used to monitor the stability of the MR image quality over time (i.e. QA of the MRI system).

The MRI shimming module 38 may be used to correct for inhomogeneities of the magnetic field ($B_0$) produced by the main magnet assembly 44. This correction is performed according to at least one of the various embodiments described herein.

The MRI imaging module 34, the MRI correction module 36 and the MRI shimming module 38 are typically implemented using software, but may be implemented using hardware such as, but not limited to, FPGA or application specific circuitry in some cases, for example.

The databases 40 can be used to store data for the MRI system such as system settings, parameter values, and calibration data. The databases 40 can also store other information required for the operation of the programs 32 or the operating system 30 such as dynamically linked libraries and the like.

The operator unit 12 comprises at least one interface that the processing unit 14 communicates with in order to receive or send information. This interface can be the user interface 18, the interface unit 20 or the wireless unit 24. For instance, information for calibrating the MRI system 10 for image correction or shimming can be inputted by someone through the user interface 18 or it can be received through the interface unit 20 from a computing device, or another electronic device such as an external memory device like a USB key or an external hard drive, for example. The processing unit 14 can communicate with either one of these interfaces as well as the display 16 or the I/O hardware 22 in order to output information related to image correction or MRI shimming. In addition, users of the operator unit 12 can communicate information across a network connection to a remote system for storage and/or further analysis. This communication can also include email communication.

A user can also use the operator unit 12 to input data related to a phantom 40 that is being imaged for the purposes of image quality monitoring and/or distortion correction. The user can also use the operator unit 12 to input information needed for system parameters that are needed for proper operation of the MRI system 10 such as calibration information and system operating parameters including scan type, scan length, magnetic field strength, the type of sampling that is used, and the like. Data that is obtained from tests, as well as parameters used for operation of the MRI system 10, may be stored in the memory unit 28. The stored data may include raw sampled data as well as processed MRI image data.

The MRI system 10 further includes an MRI device 42 that provides components for generating magnetic fields to magnetize and scan the phantom 40 and for positioning the phantom 40 at certain locations for imaging purposes. For example, the MRI device 42 may include a main magnet assembly 44, a gradient coil assembly 46, an RF coil assembly 48 and a positioning assembly 50. To reduce interference from external sources, the MRI device 42 is typically placed within an RF-shielded enclosure 52.

The main magnet assembly 44 may be a resistive magnet or a superconductive magnet which both require a power supply (not shown) for operation. Alternatively, the main magnet assembly 44 may include a permanent magnet. The main magnet assembly 44 generally includes a bore that the phantom 40 is placed within.

A shim power supply (not shown) may also be used to energize shim coils (not shown) that are used with the main magnet assembly 44 to correct any non-uniformity in the main magnetic field that is generated by the main magnet assembly 44 (with or without an imaging subject present). The gradient coils may be used for shimming as well.

In some embodiments, there may also be elements that provide mechanical shimming either alone or in combination with the aforementioned electrical shimming. For example, the mechanical shimming may comprise a collection of segments of ferromagnetic material that can be arranged within the bore of the main magnet assembly 44, such as on the inner surface of the bore itself or placed within/upon a fixed or removable tray system that can be moved in and out of the bore, for example. The ferromagnetic material may have various shapes, sizes, and material/magnetic properties in order to correct for non-uniformity in the magnetic field generated by the main magnet assembly 44.

Typically, the gradient coil assembly 46 and the RF coil assembly 48 are also placed within the bore of the main magnet assembly 44 and are circumferentially located with respect to the phantom 40. It is understood by those skilled in the art that the magnet 44, and the coils 46 and 48 can be situated in a variety of configurations around the phantom 40.

The gradient coil assembly 46 is energized to generate magnetic field gradients Gx, Gy and Gz that are superimposed on the main magnetic field $B_0$ that is produced by the main magnet assembly 44.

The RF coil assembly 48 may include one set of coils for transmitting and receiving RF energy or separate transmit and receive coils for separately transmitting and receiving RF energy, respectively. The RF coil assembly 48 generates the RF excitation pulses which, in combination with the magnetic field gradients Gx, Gy and Gz, encode spatial information into the NMR signals generated by the region of the phantom 40 being imaged. The NMR signals are also sensed by the RF coil assembly 48.

The positioning assembly 50 includes a cradle and a transport unit (both not shown) and interfaces with an alignment system (not shown) associated with the main magnet assembly 44 as is commonly known by those skilled in the art. The phantom 40 (or a patient when in field use) lies on the cradle and is positioned by the transport unit within the bore of the main magnet assembly 44. The transport unit may position the phantom 40 at certain locations within the bore of the main magnet assembly 44 in conjunction with the alignment system according to the MRI scan protocol.

The MRI system 10 further comprises a device interface unit 54 that includes a control module 56, a signal generator module 58, and a sampling module 60. The MRI system 10 further includes a gradient amplifier unit 62 and an RF unit 64. The device interface unit 54, the gradient amplifier unit 62 and the RF unit 64 may be referred to as interface circuitry that interfaces the operator unit 12 to the MRI device 42.

The control module 56 receives instructions from the operator unit 12 to follow a particular MRI scan protocol for imaging the phantom 40. The control module 56 instructs the positioning assembly 50 to move the phantom 40 into the proper position within the bore of the main magnet assembly 44 according to the MRI scan protocol. Depending on the type of magnet that is used in the main magnet assembly 44, the control module 56 may also provide certain control signals to the main magnet assembly 44 to control various parameters of the main magnetic field $B_0$ that is generated by the main magnet assembly 44. The control module 56 also instructs the signal generator module 58 to generate a particular gradient waveform sequence and pulse sequence that will be applied to the gradient coil assembly 46 and the RF coil assembly 48 by the gradient amplifier unit 62 and the RF unit 64, respectively. The control module 56 can also provide timing information to the sampling module 60, including the length and type of data acquisition that is used for sampling data from the RF coil assembly 48 during use.

The signal generator module 58 produces the proper gradient waveforms Gx, Gy and Gz as well as RF waveforms needed for a variety of MRI scan protocols including spin echo, fast spin echo, and the like. The signal generator module 58 receives control signals from the control module 56 to set the shape and timing of the magnetic field gradients that are generated by the gradient coil assembly 46. Based on these control signals, the signal generator module 58 also generates RF waveforms for setting the amplitude, shape and timing of the RF pulses that are produced by the RF coil assembly 48. Both of the sets of gradient and RF waveforms may be created digitally and the signal generator module 58 may further include a digital to analog converter (DAC) (not shown) that converts the digital waveforms to corresponding analog waveforms. The signal generator module 58 may further include a switching device (not shown) that connects the output of the DAC to either the gradient amplifier unit 62 or the RF unit 64. Alternatively, separate DACs may be used to send the gradient pulse waveforms and the RF waveforms to the gradient amplifier unit 62 and the RF unit 64, respectively. The signal generator module 58 may also generate timing signals that are sent to the sampling module 60 so that the NMR signals are correctly sampled depending on the type of gradient and RF waveforms that are sent to the gradient coil assembly 46 and the RF coil assembly 48 respectively.

The gradient amplifier unit 62 typically includes three amplifiers (not shown), i.e. one amplifier for each of the gradient pulse waveforms Gx, Gy and Gz. The gradient amplifier unit 62 receives the analog version of the gradient pulse waveforms, amplifies these waveforms and applies them to the corresponding coils in the gradient coil assembly 46. In alternative embodiments, the gradient amplifier unit 62 may receive digital waveforms and can include a DAC for processing and applying these waveforms to the corresponding coils.

The RF unit 64 generally includes a transceiver, a transmit amplifier, a receive amplifier and an analog to digital converter (ADC) (all not shown) as is commonly known to those skilled in the art. The transceiver receives the RF waveforms from the signal generator module 58 and modulates these waveforms to generate RF excitation pulses. The transmit amplifier receives and amplifies the RF excitation pulses and provides the amplified RF excitation pulses to the RF coil assembly 48 which radiates these pulses to the phantom 40. After excitation, the NMR signals generated by the phantom 40 are sensed by the RF coil assembly 48. The receive amplifier then receives the sensed NMR signals from the RF coil assembly 48, amplifies the sensed NMR signals and provides the amplified NMR signals to the transceiver. The transceiver then pre-processes the amplified NMR signals by applying demodulation and filtering. The pre-processed NMR signals are then sent to the sampling module 60 for sampling.

The sampling module 60 receives and samples the pre-processed NMR signals to produce raw k-space data. The k-space data provides information about the MRI scan in the spatial frequency domain. In some cases, the sampled k-space data may contain spatial data for each imaging "slice" that is measured and thus can be arranged into a series of two-dimensional (2D) arrays. One may interpret the k-space data in both the x and y directions as the phase information of the nuclear magnetic spins, or one may interpret the k-space data in both the x and y directions as the spatial frequency information of the MR images. In addition, k-space data along the negative x-axis and/or the negative y-axis are also typically acquired, and the accumulated phase of the nuclear magnetic spins increases as one moves away from the origin of the k-space domain. The origin of the 2D k-space data array represents DC and the edges of the 2D k-space data array distal from the origin correspond to high spatial frequencies. Alternatively, in some cases the MR images are not necessarily acquired in a slice-by-slice fashion, and various other techniques can be used as is known by those skilled in the art.

The raw k-space data is sent to the control module 56 where it may be further processed and/or sent to the processing unit 14 for processing and storing in the memory unit 28. In both cases, processing produces MRI image data from the raw k-space data. The MRI image data may be displayed on the display 16. The MRI image data may also be further image processed by either the control module 56 or the processing unit 14. Processing typically includes application of the inverse 2D Fourier Transform to generate image data from a 2D k-space data set. Accordingly, the control module 56 may further include dedicated processing circuitry such as an array processor, as is well known to those skilled in the art, which performs an inverse Fourier transform on the raw k-space data. The array processor is used to speed up numeric computation. Other types of algorithms may be applied to the MRI image to improve the quality of the MRI images, as are described herein.

Alternatively, in some embodiments, the sampling module 60 may also be coupled to the main magnet assembly 44 to record data about the main magnetizing/polarizing magnetic field.

1. Magnetic Resonance Imaging

Certain atomic nuclei possess a non-zero magnetic moment that is associated with the subatomic configuration of its nuclear constituents. The magnetic moment of such a nucleus, often referred to as the nuclear spin, will precess with a frequency of:

$$\omega(r,t) = \gamma B(r,t) \qquad (1)$$

when located at the point r in an external magnetic field B(r,t). The gyromagnetic ratio γ is a property that is specific to each nuclear species and ω(r,t) is often referred to as the Larmor frequency of precession.

In MRI, a strong static external magnetic field is generated by the main magnet assembly 44 and used to polarize the collection of magnetic nuclei within the subject or object being examined. Ideally, this static polarizing magnetic field has a strength $B_0$ and is completely uniform within a certain volume encompassing the subject or object, such that:

$$B(r,t) = B_0 \hat{z}. \qquad (2)$$

In this expression, the reference Cartesian coordinate system is chosen such that $\hat{z}$ denotes the nominal direction of the polarizing field. Under these conditions, the nuclear magnetic moments comprising the subject or object will precess with a frequency of:

$$\omega_0 = \gamma B_0 \qquad (3)$$

Once immersed in such a polarizing magnetic field, the precession frequencies of the nuclear magnetic moments may be modified through the application of an additional time-varying magnetic field $B_G(r,t)$ from the gradient coil assembly 46. In general, the time-varying magnetic field $B_G(r,t)$ can be considered as the sum of three independent gradient magnetic fields applied in a certain sequence, such that:

$$B_G(r,t) = \left[ \tilde{B}_{G_x}(r,t) + \tilde{B}_{G_y}(r,t) + \tilde{B}_{G_z}(r,t) \right] \hat{z}, \qquad (4)$$

and the Larmor frequency of precession becomes:

$$\omega(r,t) = \gamma \left[ B_0 + \tilde{B}_{G_x}(r,t) + \tilde{B}_{G_y}(r,t) + \tilde{B}_{G_z}(r,t) \right]. \qquad (5)$$

In these expressions, $\tilde{B}_{G_\upsilon}(r,t)$ denotes the gradient field corresponding to the Cartesian coordinate υ, also known as the υ-gradient, with $\upsilon \in \{x,y,z\}$. In a typical MRI apparatus, each of the gradient fields $\tilde{B}_{G_\upsilon}(r,t)$ may be independently generated and controlled. Hence, it is instructive to express the gradient field as the product:

$$\tilde{B}_{G_\upsilon}(r,t) = m_\upsilon(t) B_{G_\upsilon}(r), \qquad (6)$$

where $m_\upsilon(t)$ represents the time dependent gradient field amplitude and $B_{G_\upsilon}(r)$ describes the relative spatial distribution of the magnetic field intensity. Whereas $m_\upsilon(t)$ is a control signal that dictates the activity of the gradient field $\tilde{B}_{G_\upsilon}(r,t)$ over time for a particular imaging sequence, $B_{G_\upsilon}(r)$ is a static property of the gradient that is determined by the geometry of the field generating device. In an ideal MRI system, the gradients are orthogonal and $B_{G_\upsilon}(r)$ varies linearly with υ:

$$B_{G_\upsilon}(r) = G_\upsilon \upsilon, \qquad (7)$$

where $G_\upsilon$ denotes the gradient strength.

Under the influence of ideal gradients, the electronic signal s(k) generated from the entire subject or object following complete excitation is given by the three dimensional Fourier transform:

$$s(k) = \int_{\mathfrak{R}^3} \rho_s(r) e^{-i2\pi k \cdot r} d^3 r, \qquad (8)$$

where $\rho_s(r)$ denotes the spin density distribution. The components of the conjugate parameter $$k = [k_x \ k_y \ k_z]^T$$

are defined according to equation 9.

$$k_\upsilon = \frac{\gamma}{2\pi} G_\upsilon \int_0^t m_\upsilon(t') dt' \qquad (9)$$

The reconstructed image of the subject $\hat{\rho}_s(r)$ is then given by the inverse three dimensional Fourier transform of the measured signal $\hat{s}(k)$ as shown in equation 10.

$$\hat{\rho}_s(r) = \int_{\mathfrak{R}^3} \hat{s}(k) e^{i2\pi k \cdot r} d^3 k. \qquad (10)$$

2. Influence of Magnetic Field Imperfections

In reality, the static polarizing magnetic field is not perfectly uniform. Rather, the realistic (i.e. actual) polarizing field $B'_0(r)$ can be expressed as:

$$B'_0(r) = B_0 + \Delta B_0(r) + \Delta B_S(r) \qquad (11)$$

where $\Delta B_0(r)$ and $\Delta B_S(r)$ represent spatial variations due to imperfections in the field generating device and the non-zero magnetic susceptibility of the subject or object that is being examined, respectively. Similarly, the magnetic field gradients do not exhibit a purely linear profile in space. Instead, the realistic gradient field $B'_{G_\upsilon}(r)$ can be expressed as:

$$B'_{G_\upsilon}(r) = G_\upsilon \upsilon + \Delta B_{G_\upsilon}(r), \qquad (12)$$

where $\Delta B_{G_\upsilon}(r)$ denotes the nonlinear component. Under these non-ideal conditions, the electronic signal s(k) generated from the entire subject or object following excitation is given by:

$$s(k) = \int_{\mathfrak{R}^3} \rho_s^+(r^+) e^{-i2\pi k \cdot r^+} d^3 r^+, \quad (13)$$

where $$r^+ = [x^+ \ y^+ \ z^+]^T$$

represents the apparent coordinates of the nuclear magnetic moments. The modified spin density function $\rho_s^+(r^+)$ is given by:

$$\rho_s^+(r^+) = \rho_s(r) \left| \frac{\partial(x, y, z)}{\partial(x^+, y^+, z^+)} \right|, \quad (14)$$

and the reconstructed image $\hat{\rho}_s^+(r^+)$ is given by:

$$\hat{\rho}_s^+(r^+) = \int_{\mathfrak{R}^3} \hat{s}(k) e^{i2\pi k \cdot r^+} d^3 k. \quad (15)$$

As an example, for a 3D imaging sequence with the read-encode gradient along the x-axis and phase-encoding performed along the y- and z-axes, the coordinates $r^+$ are related to the true coordinates $$r = [x \ y \ z]^T$$

via equation 16.

$$x^+ = x + \frac{\Delta B_{G_x}(r)}{G_x} + \frac{\Delta B_0(r)}{G_x} + \frac{\Delta B_S(r)}{G_x} \quad (16)$$
$$y^+ = y + \frac{\Delta B_{G_y}(r)}{G_y}$$
$$z^+ = z + \frac{\Delta B_{G_z}(r)}{G_z}$$

Thus, in the presence of static polarizing field inhomogeneities and gradient field nonlinearities, an object located at the point r in real space is incorrectly located at the point $r^+$ in the reconstructed image space. The vector difference between the true coordinates r and the image coordinates $r^+$ at any point in the imaged volume represents the geometric distortion field affecting the MR images.

If an additional image is acquired with the polarity of the read-encode gradient reversed, then the apparent image coordinates are given by equation 17.

$$x^- = x + \frac{\Delta B_{G_x}(r)}{G_x} - \frac{\Delta B_0(r)}{G_x} - \frac{\Delta B_S(r)}{G_x} \quad (17)$$
$$y^- = y + \frac{\Delta B_{G_y}(r)}{G_y}$$
$$z^- = z + \frac{\Delta B_{G_z}(r)}{G_z}$$

Hence, the contribution of the imperfections in the polarizing and gradient magnetic fields can be separated using the following relations in equations 18 and 19.

$$\frac{r^+ - r^-}{2} = \begin{bmatrix} \frac{\Delta B_0(r)}{G_x} + \frac{\Delta B_S(r)}{G_x} \\ 0 \\ 0 \end{bmatrix}, \quad (18)$$

$$\frac{r^+ + r^-}{2} = \begin{bmatrix} \frac{\Delta B_{G_x}(r)}{G_x} \\ \frac{\Delta B_{G_y}(r)}{G_y} \\ \frac{\Delta B_{G_z}(r)}{G_z} \end{bmatrix} \quad (19)$$

3. The Harmonic Distortion Field

The spatial distribution of the geometric distortion can be fully described by the distortion field $\delta(r)$ given by:

$$\delta(r) = r' - r = [\delta_x(r) \delta_y(r) \delta_z(r)]^T = \begin{bmatrix} x' - x \\ y' - y \\ z' - z \end{bmatrix}, \quad (20)$$

where $$r = [x \ y \ z]^T$$

and $$r' = [x' \ y' \ z']^T$$

denote the true and distorted image coordinates, respectively. When encompassing all sources of geometrical distortion, the distorted image coordinates can be given by equations 16 or 17. Alternatively, if the sources of distortion are to be separated, the distortion field can be given by equations 18 or 19. Thus, the components of the distortion field $\delta(r)$ generally take the form:

$$\delta_\upsilon(r) = \sum_{i=1}^{N_\upsilon} c_{\upsilon,i} \Delta B_{z,i}(r), \upsilon \in \{x, y, z\}, \quad (21)$$

where the index i enumerates the $N_\upsilon$ sources of distortion, each of which is characterized by a spatially dependent harmonic quantity $\Delta B_{z,i}(r)$ and a constant scaling factor $c_{\upsilon,i}$.

Within a region of interest $\Omega$ that is free of currents or time-varying electric fields, any magnetic field $$B = [B_x \ B_y \ B_z]^T$$

satisfies Laplace's vector equation:

$$\nabla^2 B_x \hat{x} + \nabla^2 B_y \hat{y} + \nabla^2 B_z \hat{z} = 0, r \in \Omega, \quad (22)$$

where the scalar Laplacian operator $\nabla^2$ is defined as given in equation 23.

$$\nabla^2 = \frac{\partial^2}{\partial x^2} + \frac{\partial^2}{\partial y^2} + \frac{\partial^2}{\partial z^2} \qquad (23)$$

Since each component of the magnetic field B is independent:

$$\nabla^2 B_\upsilon = 0, r \in \Omega, \upsilon \in \{x,y,x\}, \qquad (24)$$

operating on the distortion field given in equation 21 with the Laplacian operator yields the relation shown in equation 25.

$$\nabla^2 \delta_\upsilon(r) = \nabla^2 \left[ \sum_{i=1}^{N_\upsilon} c_{\upsilon,i} \Delta B_{z,i}(r) \right] = \sum_{i=1}^{N_\upsilon} c_{\upsilon,i} \nabla^2 [\Delta B_{z,i}(r)] = 0, r \in \Omega \qquad (25)$$

Hence, the distortion field $\delta(r)$ and its individual vector components satisfy Laplace's equation. Therefore, the distortion field $\delta(r)$ is a harmonic function within the region of interest $\Omega$.

In general, harmonic functions possess the special property that they are uniquely determined within a region $\Omega$ by their value on the boundary $\partial \Omega$ of the region of interest $\Omega$. That is, provided that the distortion field component $\delta_\upsilon(r)$ is known on $\partial \Omega$ according to:

$$\delta_\upsilon(r) = f_\upsilon(r), r \in \partial \Omega, \qquad (26)$$

for some arbitrary boundary function $f_\upsilon(r)$, then the entire function $\delta_\upsilon(r)$ within $\Omega$ can be calculated. In other words, the distortion field $\delta_\upsilon(r)$ can be determined as the solution to the boundary value problem (BVP) defined as shown in equation 27.

$$\nabla^2 \delta^\upsilon(r) = 0, r \in \Omega,$$

$$\delta_\upsilon(r) = f_\upsilon(r), r \in \partial \Omega \qquad (27)$$

In at least one embodiment described herein, the solution to the BVP is determined using the harmonic expansion:

$$\delta_\upsilon(r) = \sum_{i=0}^{\overline{N}} \left( \sum_{j=0}^{\infty} a_{\upsilon,i,j} \psi_{i,j}(r) \right), r \in \Omega, \qquad (28)$$

where the index i enumerates $\overline{N}$ sub-portions of the domain $\Omega$, each denoted as $\Lambda_i$ and preferably being sub-portions of the boundary $\partial \Omega$, such that $\Lambda_i \subset \partial \Omega$ and $\cup_i \Lambda_i = \partial \Omega$. The harmonic basis function denoted as $\psi_{i,j}(r)$ is a solution of Laplace's equation. Although $\psi_{i,j}(r)$ may take many functional forms, the basis functions may be chosen such that the set $\{\psi_{i,j}(r) : j \in \mathbb{Z}^+\}$ represents an orthogonal basis on the region $\Lambda_i$. For this choice of basis, the expansion coefficients $a_{\upsilon,i,j}$ are given by:

$$a_{\upsilon,i,j} = \frac{\langle \delta_\upsilon(r), \psi_{i,j}(r) \rangle_i}{\langle \psi_{i,j}(r), \psi_{i,j}(r) \rangle_i}, \qquad (29)$$

where the well-known inner product operator is given by:

$$\langle g(r), h(r) \rangle_i = \int_{\Lambda_i} g(r) h^*(r) d\Lambda_i, \qquad (30)$$

for any two functions $g(r)$ and $h(r)$ defined on $\Lambda_i$, with the asterisk * denoting complex conjugation. Thus, the harmonic expansion in equation 28 can be calculated at all points within the region of interest $\Omega$ provided that the distortion field $\delta_\upsilon(r)$ is known on the boundary $\partial \Omega$ of the region of interest $\Omega$.

Often the integrals involved in the evaluation of equation 29 are not available in closed form, in which case numerical integration techniques are employed to solve the equation. In particular, an $N_k$-point numerical quadrature rule can be used, which provides an approximation of the form (Stroud, A. H., *Approximate Calculation of Multiple Integrals* 1971, New Jersey: Prentice-Hall):

$$\int_{\Lambda_i} w(r) f(r) d\Lambda_i \cong \sum_{k=1}^{N_k} \zeta_k f(r_k), \qquad (31)$$

where $w(r)$ is a weight function on $\Lambda_i$, $f(r)$ is an arbitrary function on $\Lambda_i$, and $\zeta_k$ represents the quadrature coefficient associated with the quadrature node $r_k$. Quadrature rules are typically used in numerical integration techniques since the integrand only needs to be evaluated at a finite number ($N_k$) of points, which is often the case in reality due to finite sampling/measurements. The mathematical operation of equation 31 is a summation of weighted integrand values, which is easy to implement on a computing device and executes very fast.

Although the harmonic expansion in equation 28 generally contains an infinite number of terms, it is often practical to approximate the distortion field $\delta_\upsilon(r)$ with the truncated summation:

$$\delta_\upsilon(r) \approx \sum_{i=0}^{\overline{N}} \left( \sum_{j=0}^{\overline{M_i}} a_{\upsilon,i,j} \psi_{i,j}(r) \right), r \in \Omega, \qquad (32)$$

where $\overline{M}_i$ denotes the number of terms retained for the $i^{th}$ inner summation. In practice, it is appreciated that the accuracy of this approximation depends on the number of terms included in each inner summation increases. Hence, the optimal choice for each of the number of terms $\overline{M}_i$ depends on the nature of the distortion field $\delta_\upsilon(r)$ and the desired level of accuracy.

As will be appreciated in the following examples, the geometry of $\Omega$ (or more specifically, the geometry of each of the $\Lambda_i$) dictates the choice of the orthogonal basis sets used in the harmonic expansion in equation 28. In particular, for an ROI possessing a sufficiently complex geometry, an appropriate choice of basis sets may not even be known. Thus, it is not always possible to establish an analytic harmonic expansion for the distortion field. However, a harmonic representation of the distortion field may be obtained by solving Laplace's equation using a numerical technique for solving second-order BVPs with arbitrary boundary geometries, such as, but not limited to, finite difference methods, finite volume methods, finite element methods, boundary element methods, and the like. Furthermore, it can also be appreciated by those skilled in the art that an interpolating function comprised of harmonic interpolants may be generated given the value of the distortion field $\delta_\upsilon(r)$ at a collection of points on the boundary $\partial \Omega$. This interpolating function may then be used to reconstruct the values of the distortion field $\delta_\upsilon(r)$ within the region of interest $\Omega$. The free parameters or coefficients in the interpolating function may be calculated using various numerical methods such as, but not limited to, curve fitting or regression analysis, for example.

4. Case Studies 4.1. Spherical Region of Interest

In an example embodiment, the region of interest $\Omega$ is taken as a sphere of radius R centered on the origin (e.g. $[0\ 0\ 0]^T$). For simplicity, a spherical coordinate system defined by the vector $[r\ \theta\ \phi]^T$ can be used. The transformation between the Cartesian and spherical coordinates is given by:

$$\begin{cases} x = r\cos\phi\sin\theta \\ y = r\sin\phi\sin\theta \\ z = r\cos\theta \end{cases} \quad (33)$$

and the Laplacian operator from equation 23 can be transformed as shown in equation 34.

$$\nabla^2 = \frac{1}{r^2}\frac{\partial}{\partial r}\left(r^2\frac{\partial}{\partial r}\right) + \frac{1}{r^2\sin\theta}\frac{\partial}{\partial\theta}\left(\sin\theta\frac{\partial}{\partial\theta}\right) + \frac{1}{r^2\sin^2\theta}\frac{\partial^2}{\partial\phi^2} \quad (34)$$

An appropriate expansion of $\delta_\upsilon(r,\theta,\phi)$ in the form of equation 28 is then given by the spherical harmonic expansion (Jackson, J. D., *Classical Electrodynamics*, 3rd Ed. 1998: Wiley):

$$\delta_\upsilon(r,\theta,\phi) = \sum_{l=0}^{\infty}\sum_{m=-l}^{l} A_{\upsilon,l,m} r^l y_{l,m}(\theta,\phi), \quad (35)$$

where the expansion coefficients are denoted as $A_{\upsilon,l,m}$, and $y_{l,m}(\theta,\phi)$ is the real spherical harmonic function of order l and degree m, given by equation 36.

$$y_{l,m}(\theta,\phi) = \begin{cases} \sqrt{2}\,N_l^{|m|} P_l^{|m|}(\cos\theta)\sin(|m|\phi) & \text{for } m < 0, \\ N_l^0 P_l^0(\cos\theta) & \text{for } m = 0, \\ \sqrt{2}\,N_l^m P_l^m(\cos\theta)\cos(m\phi) & \text{for } m > 0. \end{cases} \quad (36)$$

In this expression, $P_l^m(\cos\theta)$ denotes the associated Legendre polynomial of order l and degree m, and the normalization factor $N_l^m$ is given by equation 37.

$$N_l^m = \sqrt{\frac{(2l+1)}{4\pi}\frac{(l-m)!}{(l+m)!}} \quad (37)$$

According to the principles outlined in Section 3, the expansion coefficients are given by equation 29, which in this example reduces to:

$$A_{\upsilon,l,m} = \frac{1}{R^l}\int_{-\pi}^{\pi}\int_0^{\pi} \eta_\upsilon(\theta,\phi) y_{l,m}(\theta,\phi)\sin\theta\,d\theta\,d\phi, \quad (38)$$

where $\eta_\upsilon(\theta,\phi)$ is the value of $\delta_\upsilon(r,\theta,\phi)$ on the boundary $\partial\Omega$ of $\Omega$, such that the relation in equation 39 holds true.

$$\delta_\upsilon(R,\theta,\phi) = \eta_\upsilon(\theta,\phi) \quad (39)$$

Thus given knowledge of the distortion field $\delta_\upsilon(r,\theta,\phi)$ on the boundary $\partial\Omega$ of the region of interest $\Omega$, the distortion field may be calculated at any point within $\Omega$ using the expansion in equation 35. Furthermore, the expression in equation 35 may also be used to calculate the distortion field $\delta_\upsilon(r,\theta,\phi)$ within any sphere (of radius r>R) provided that equation 22 remains valid.

4.2 Cylindrical Region of Interest

In another example embodiment, the region of interest $\Omega$ is defined as a cylinder of radius a and length b centered on the origin ($[0\ 0\ 0]^T$). By introducing the cylindrical coordinate system defined by the vector $[\rho\ \phi\ z]^T$, the Cartesian coordinates are given by:

$$\begin{cases} x = \rho\cos\phi \\ y = \rho\sin\phi \\ z = z \end{cases} \quad (40)$$

and the Laplacian operator in equation 23 becomes as shown in equation 41.

$$\nabla^2 = \frac{1}{\rho}\frac{\partial}{\partial\rho}\left(\rho\frac{\partial}{\partial\rho}\right) + \frac{1}{\rho^2}\frac{\partial^2}{\partial\phi^2} + \frac{\partial^2}{\partial z^2}. \quad (41)$$

An appropriate expansion of $\delta_\upsilon(\rho,\phi,z)$ in the form of equation 28 is then given by the cylindrical harmonic expansion:

$$\delta_\upsilon(\rho,\phi,z) = \sum_{l=0}^{\infty}\bigg[A_{\upsilon,l}^+ g_l^+(\rho,\phi,z) + \quad (42)$$
$$B_{\upsilon,l}^+ h_l^+(\rho,\phi,z) + A_{\upsilon,l}^- g_l^-(\rho,\phi,z) + B_{\upsilon,l}^- h_l^-(\rho,\phi,z) +$$
$$\ldots + \sum_{m=1}^{\infty}[C_{\upsilon,l,m}^+ s_{l,m}^+(\rho,\phi,z) + D_{\upsilon,l,m}^+ t_{l,m}^+(\rho,\phi,z) +$$
$$C_{\upsilon,l,m}^- s_{l,m}^-(\rho,\phi,z) + D_{\upsilon,l,m}^- t_{l,m}^-(\rho,\phi,z) + \ldots +$$
$$E_{\upsilon,l,m} u_{l,m}(\rho,\phi,z) + F_{\upsilon,l,m} v_{l,m}(\rho,\phi,z)]\bigg],$$

where the expansion coefficients are denoted as $A_{\upsilon,l}^+$, $B_{\upsilon,l}^+$, $A_{\upsilon,l}^-$, $B_{\upsilon,l}^-$, $C_{\upsilon,l,m}^+$, $D_{\upsilon,l,m}^+$, $C_{\upsilon,l,m}^-$, $D_{\upsilon,l,m}^-$, $E_{\upsilon,l,m}$, $F_{\upsilon,l,m}$, and the harmonic basis functions are denoted as $g_l^+(\rho,\phi,z)$, $h_l^+(\rho,\phi,z)$, $g_l^-(\rho,\phi,z)$, $h_l^-(\rho,\phi,z)$, $s_{l,m}^+(\rho,\phi,z)$, $t_{l,m}^+(\rho,\phi,z)$, $s_{l,m}^-(\rho,\phi,z)$, $t_{l,m}^-(\rho,\phi,z)$, $u_{l,m}(\rho,\phi,z)$, $v_{l,m}(\rho,\phi,z)$. The harmonic basis functions can be expressed as:

$$\begin{Bmatrix} g_l^+(\rho,\phi,z) \\ h_l^+(\rho,\phi,z) \end{Bmatrix} = \frac{\rho^l}{b}\left(z+\frac{b}{2}\right)\begin{Bmatrix} \cos(l\phi) \\ \sin(l\phi) \end{Bmatrix} \quad (43)$$

$$\begin{Bmatrix} g_l^-(\rho,\phi,z) \\ h_l^-(\rho,\phi,z) \end{Bmatrix} = -\frac{\rho^l}{b}\left(z-\frac{b}{2}\right)\begin{Bmatrix} \cos(l\phi) \\ \sin(l\phi) \end{Bmatrix}$$

$$\begin{Bmatrix} s_{l,m}^+(\rho,\phi,z) \\ t_{l,m}^+(\rho,\phi,z) \end{Bmatrix} = \sinh\left(\frac{\xi_{l,m}}{a}\left[z+\frac{b}{2}\right]\right)J_l\left(\frac{\xi_{l,m}}{a}\rho\right)\begin{Bmatrix} \cos(l\phi) \\ \sin(l\phi) \end{Bmatrix}$$

$$\begin{Bmatrix} s_{l,m}^-(\rho,\phi,z) \\ t_{l,m}^-(\rho,\phi,z) \end{Bmatrix} = \sinh\left(\frac{\xi_{l,m}}{a}\left[z-\frac{b}{2}\right]\right)J_l\left(\frac{\xi_{l,m}}{a}\rho\right)\begin{Bmatrix} \cos(l\phi) \\ \sin(l\phi) \end{Bmatrix}$$

$$\begin{Bmatrix} u_{l,m}(\rho,\phi,z) \\ v_{l,m}(\rho,\phi,z) \end{Bmatrix} = \sin\left(\frac{m\pi}{b}\left[z+\frac{b}{2}\right]\right)I_l\left(\frac{m\pi}{b}\rho\right)\begin{Bmatrix} \cos(l\phi) \\ \sin(l\phi) \end{Bmatrix},$$

where $$J_l\left(\frac{\xi_{l,m}}{a}\rho\right)$$

denotes the Bessel function of the first kind of order l, $\xi_{l,m}$ denotes the $m^{th}$ ordered zero of $J_l$, such that $J_l(\xi_{l,m})=0$ and $\xi_{l,m} < \xi_{l,m+1}$.

$$I_l\left(\frac{m\pi}{b}\rho\right)$$

denotes the Bessel function of the second kind of order l. The expansion coefficients are given by equation 29, which in this case yields:

$$\begin{Bmatrix} A_{p,l}^+ \\ B_{p,l}^+ \end{Bmatrix} = \frac{1}{\pi a^l} \int_{-\pi}^{\pi} \alpha_p^+(\phi) \begin{Bmatrix} (1+\delta_{0,l})^{-1}\cos(l\phi) \\ (1-\delta_{0,l})\sin(l\phi) \end{Bmatrix} d\phi \quad (44)$$

$$\begin{Bmatrix} A_{p,l}^- \\ B_{p,l}^- \end{Bmatrix} = \frac{1}{\pi a^l} \int_{-\pi}^{\pi} \alpha_p^-(\phi) \begin{Bmatrix} (1+\delta_{0,l})^{-1}\cos(l\phi) \\ (1-\delta_{0,l})\sin(l\phi) \end{Bmatrix} d\phi$$

$$\begin{Bmatrix} C_{p,l,m}^+ \\ D_{p,l,m}^+ \end{Bmatrix} = \frac{2}{\pi a^2 \sinh\left(\frac{\xi_{l,m}}{a}b\right)[J_{l+1}(\xi_{l,m})]^2} \times \ldots \times$$

$$\int_{-\pi}^{\pi} \int_0^a \beta_p^+(\rho,\phi) J_l\left(\frac{\xi_{l,m}}{a}\rho\right) \begin{Bmatrix} (1+\delta_{0,l})^{-1}\cos(l\phi) \\ (1-\delta_{0,l})\sin(l\phi) \end{Bmatrix} \rho d\rho d\phi$$

$$\begin{Bmatrix} C_{p,l,m}^- \\ D_{p,l,m}^- \end{Bmatrix} = \frac{-2}{\pi a^2 \sinh\left(\frac{\xi_{l,m}}{a}b\right)[J_{l+1}(\xi_{l,m})]^2} \times \ldots \times$$

$$\int_{-\pi}^{\pi} \int_0^a \beta_p^-(\rho,\phi) J_l\left(\frac{\xi_{l,m}}{a}\rho\right) \begin{Bmatrix} (1+\delta_{0,l})^{-1}\cos(l\phi) \\ (1-\delta_{0,l})\sin(l\phi) \end{Bmatrix} \rho d\rho d\phi$$

$$\begin{Bmatrix} E_{p,l,m} \\ F_{p,l,m} \end{Bmatrix} = \frac{2}{\pi b I_l\left(\frac{m\pi}{b}a\right)} \times \ldots \times \int_{-\pi}^{\pi} \int_{-b/2}^{b/2} \gamma_p(\phi,z)$$

$$\sin\left(\frac{m\pi}{b}\left[z+\frac{b}{2}\right]\right)(1-\delta_{0,m}) \begin{Bmatrix} (1+\delta_{0,l})^{-1}\cos(l\phi) \\ (1-\delta_{0,l})\sin(l\phi) \end{Bmatrix} dz d\phi$$

where the functions $\alpha_\upsilon^+(\phi)$, $\alpha_\upsilon^-(\phi)$, $\beta_\upsilon^+(\rho,\phi)$, $\beta_\upsilon^-(\rho,\phi)$, $\gamma_\upsilon(\phi,z)$ are completely determined by the value of the distortion field $\delta_\upsilon(\rho,\phi,z)$ on the boundary $\partial\Omega$ of the region of interest $\Omega$, through the relations shown in equation 45.

$$\delta_\upsilon\left(a,\phi,\frac{b}{2}\right) = \alpha_\upsilon^+(\phi) \quad (45)$$

$$\delta_\upsilon\left(a,\phi,-\frac{b}{2}\right) = \alpha_\upsilon^-(\phi)$$

$$\delta_\upsilon\left(\rho,\phi,\frac{b}{2}\right) = \beta_\upsilon^+(\rho,\phi) + \sum_{l=0}^{\infty}\left[A_{\upsilon,l}^+ g_l^+\left(\rho,\phi,\frac{b}{2}\right) + B_{\upsilon,l}^+ h_l^+\left(\rho,\phi,\frac{b}{2}\right)\right]$$

$$\delta_\upsilon\left(\rho,\phi,-\frac{b}{2}\right) =$$

$$\beta_\upsilon^-(\rho,\phi) + \sum_{l=0}^{\infty}\left[A_{\upsilon,l}^- g_l^-\left(\rho,\phi,-\frac{b}{2}\right) + B_{\upsilon,l}^- h_l^-\left(\rho,\phi,-\frac{b}{2}\right)\right]$$

$$\delta_\upsilon(a,\phi,z) = \gamma_\upsilon(\phi,z) + \ldots + \sum_{l=0}^{\infty}[A_{\upsilon,l}^+ g_l^+(a,\phi,z) +$$

$$B_{\upsilon,l}^+ h_l^+(a,\phi,z) + A_{\upsilon,l}^- g_l^-(a,\phi,z) + B_{\upsilon,l}^- h_l^-(a,\phi,z)],$$

Thus given knowledge of the distortion field $\delta_\upsilon(\rho,\phi,z)$ on the boundary $\partial\Omega$ of a region of interest $\Omega$, the distortion field may be calculated at any point within the region of interest $\Omega$ using the expansion in equation 42.

5. Phantom Design

Using harmonic analysis, the MR image distortion field inside a given volume can be fully determined by knowing only the distortion values on the surface of the volume. Thus, it is not required to densely map the volume, e.g. by using a grid-profile phantom, in order to accurately capture the local characteristics of the field.

Phantoms with arbitrary shapes can be designed to feature control points distributed across their surfaces. In this context, the control points may refer to sampling points of measured distortion data, which can be acquired as localized contrast regions (e.g. the intersection of lines, points in space, etc.) or continuous maps.

The spacing for these sampling points that will provide good data for image correction will depend on the choice of metric that is used to evaluate the harmonic analysis and distortion field generation. Furthermore, the accuracy of the harmonic analysis and the selected sampling point distribution may depend on at least one of the following parameters:

1) the geometry (e.g. shape, size, etc.) of the ROI and its boundary;
2) the desired level of accuracy in the volumetric distortion field reconstruction;
3) the uncertainty and error in the measured distortion values on the ROI boundary;
4) the interpolation method (if applicable) used to calculate the distortion values at the quadrature nodes from the directly measured distortion values on the ROI boundary;
5) the numerical integration (i.e. quadrature) method employed in the harmonic analysis;
6) the magnitude and nature of the distortion field distribution itself; and
7) the number (and order) of terms used in a truncated harmonic expansion for the volumetric distortion field reconstruction.

In theory, for a given numerical integration (i.e. quadrature) method, increasing the density of the sampling points will lead to greater accuracy in the harmonic reconstruction. In practice, for a certain set of parameters, a threshold for selecting the sampling distance can be determined based on points 1 to 7 above.

Figure 2B:
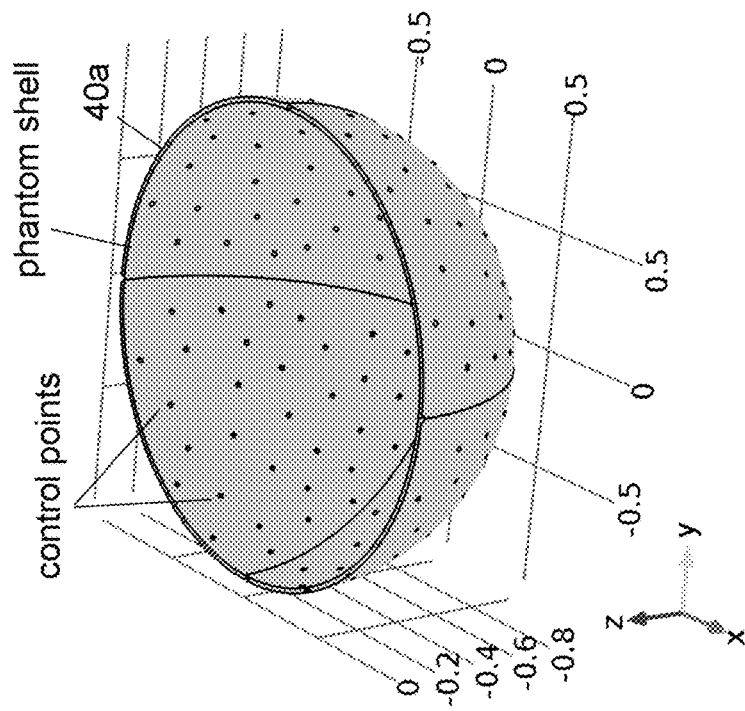
FIGS. 2A and 2B show an example embodiment of a spherical phantom with a hollow inner cavity and a surface shell embedding control points.
Figure 2A:
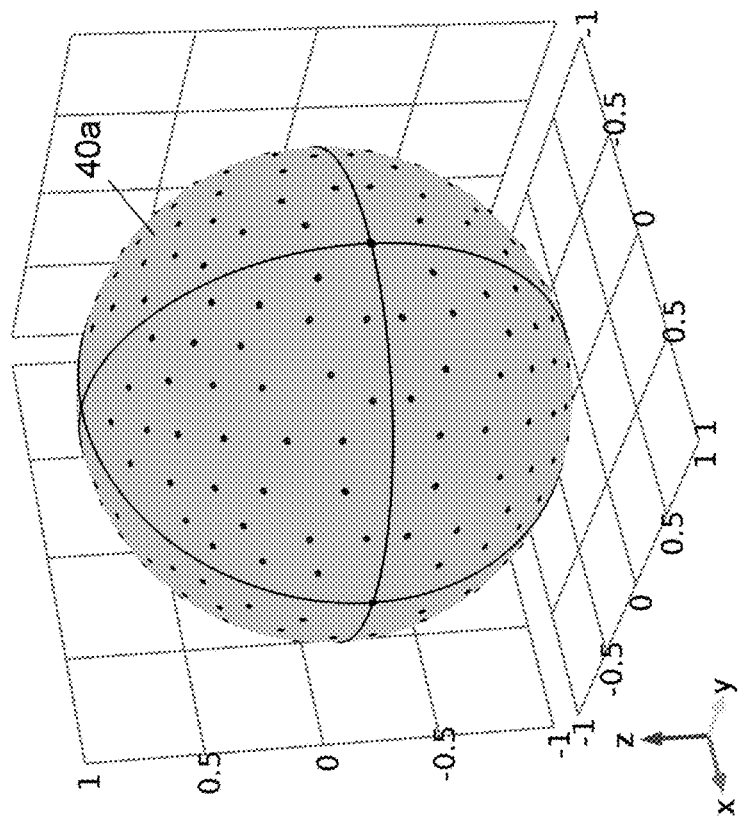

For example, one phantom embodiment is shown in FIGS. 2A and 2B. The phantom 40a is a hollow sphere with a relatively thin shell, which carries the control points required for the distortion field mapping on the ROI boundary. The control points can be manufactured to display either positive or negative contrast in MR images. For example, the control points may be:

a) cavities of arbitrary shapes filled with contrast material such as but not limited to water, copper sulphate solution, mineral oil and the like embedded in a hard shell such as but not limited to plastic, perspex, acrylic, polyurethane and the like (in this case, the control points will show up as a positive contrast in the MR scan, i.e. a bright spots or a bright signal on a dark background); or b) solid markers (arbitrary shapes) such as but not limited to plastic, perspex, acrylic, polyurethane, and the like surrounded by a bath of contrast material such as but not limited to water, copper sulphate solution, mineral oil and the like (for this scenario, the MR images of the phantom will show the control points as dark spots or a dark signal on a bright background).

Figures 3A, 3B:
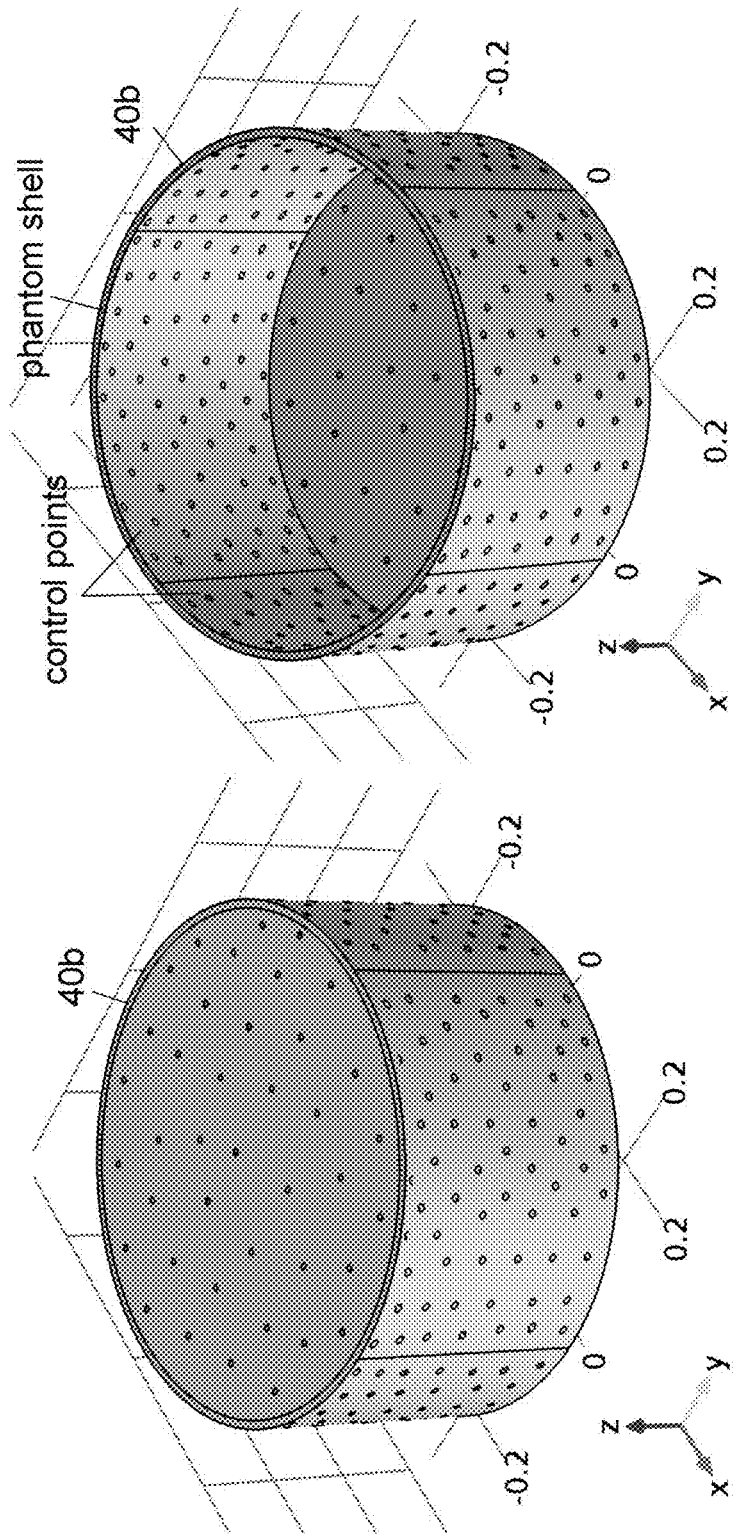
FIGS. 3A and 3B show an example embodiment of a cylindrical phantom with control points located in the cylinder's shell and the phantom inside is hollow.

Referring now to FIGS. 3A and 3B, shown therein is an example embodiment of a cylindrical phantom 40b with control points located in the cylinder's shell and the inside of the phantom 40b is hollow. Similar to the spherical phantom 40a, the cylindrical phantom 40b is filled with air and features the control points distributed on its surface. In other embodiments, the control points can be distributed within an inner surface of the shell of the phantom 40*b* or within the shell of the phantom 40*b* (the same applies to phantom 40*a*). The phantom design concept can be extended to any arbitrary shape. One of the differences in using a particular phantom is given by the set of basis functions that may be most convenient for use in the harmonic description of the distortion field for the particular phantom since the choice of basis is often surface shape-dependent.

The harmonic field description is taken as the solution of a second-order boundary value problem comprised of Laplace's equation. The boundary conditions of this BVP are derived from measurements of the distortion on the surface of the phantom. For the spherical and cylindrical phantoms 40*a* and 40*b*, harmonic solutions are given by equations 37 and 41, respectively. Furthermore, for certain phantom shapes (e.g. those that are geometrically complex) an appropriate set of basis functions may not even be known. As such, these phantom designs involve solving Laplace's equation by some method other than an analytic harmonic expansion. Fortunately, there are many numerical techniques that are readily available for solving second-order BVPs with arbitrary boundary geometries, e.g. finite difference methods, finite volume methods, finite element methods, boundary element methods, and the like.

It should be known that the selection of the shape of the phantom 40 depends on the size of the region of interest, the image quality (e.g. image resolution) of the MR scanner as well as the ease of building the phantom 40 for that particular size region of interest. For example, the diameter of a spherical phantom may vary from up to 50 cm or greater depending on the imaging quality of the MR scanner that it is used with. In addition, it may be easier to build a cylindrical phantom versus a spherical phantom for some sizes. In addition, since MR scanners differ for different manufacturers and from year to year for the same manufacturer, a phantom having a slightly different size or geometry (compared to what was used previously) may be used with a newer MR scanner in order to get good image correction results.

One principle that may be used for selecting a size and shape for the phantom 40 is based on selecting the phantom 40 so that it can generate signals that can be measured in order to do the distortion characterization and image correction for a desired resolution. Accordingly, the examples that follow are meant for illustrative purposes only and the dimensions or shapes that are given in these examples may need to be changed depending on the various aforementioned factors.

In one example, for small fields of view, i.e. up to about 25 cm, either a spherical or cylindrical phantom may be sufficient to cover and characterize the entire field.

In another example, for medium-size ROIs, in the range of about 25 cm to about 35 cm, signal loss may be present at the periphery of the MR imaging volume, depending on the MR scanner characteristics. For this, a cylindrical phantom may be more appropriate.

In another example, for large ROIs, encompassing the entire active MR imaging volume (typically a sphere of about 40 to about 50 cm in diameter), a spherical or cylindrical design for the phantom 40 may not be sufficient due to large image intensity inhomogeneities and signal fall off that may occur, which would generate missing data on the surface of a large spherical/cylindrical phantom. In order to collect distortion information for the rest of the MR imaging volume beyond using a spherical or cylindrical shaped phantom 40 with an ROI that is covered by the harmonic analysis described herein, a hybrid phantom design may be used, examples of which now follow.

As another example, a phantom embodiment for large imaging fields may include the following complementary regions:

a) a central spherical (e.g. about 25-30 cm diameter) or cylindrical (e.g. about 30-35 cm in diameter for the circular cross-section and about 25-30 cm in height) structure for which the distortions are determined via the disclosed harmonic analysis; and b) phantom extensions beyond region (a) to cover the rest of the imaging field in which the phantom extensions may have different geometric configurations, e.g. 2D/3D grid, contour lines with pre-defined patterns or any arbitrary 2D/3D distribution of structural features that may be used to quantify geometric distortions in MR images. For this extension region(s), the distortion field may be determined by directly comparing the MR representation of the extension region(s) with a template (derived from the manufacturing process or obtained by imaging the phantom extensions on a geometric distortion free imaging modality (e.g., computed tomography (CT), cone beam CT (CBCT)). The process is described with respect to FIG. 4.

As mentioned previously, it should be noted that the examples given above are just given for illustrative purposes as the ROI dimension and geometry are arbitrary. However, spheres or cylinders or other shapes may be chosen as indicated herein since the data is obtained and the characterization is performed in the same manner. Also, the phantom 40 need not be hollow, as in the case of using modular inserts, for example.

An alternative phantom design for large ROIs may consist of an arbitrary surface shape (and associated harmonic analysis), not limited to quadric geometries (sphere, cylinder) but also including cuboids as well as any irregular shape.

Considering that the harmonic analysis approach removes the need for a dense mapping of the entire imaging volume, the hollow space inside the phantom 40 (e.g. spherical, cylindrical, or otherwise) can be used to add inserts for various objectives. Another example phantom embodiment includes removable/interchangeable phantom inserts for at least one of:

a) validation of the harmonic analysis method (see the validation test of FIG. 4) using a known geometry such as a coarse 2D/3D grid pattern;

b) additional layers of control points on which the harmonic analysis can be performed for data verification and redundancy;

c) testing the image quality of the MR scanner, e.g. contrast, resolution, field uniformity, and the like;

d) housing a radiation dosimetry system (single or multiple dosimeters with a 2D/3D arbitrary distribution), which may be used in the case of quality assurance testing and commissioning activities for MR-linac and MR-$^{60}$Co systems which feature a magnetic field for MRI that is present during the delivery of radiation fields; and e) calibration for quantitative and functional MR imaging (e.g. correlation of image pixels with tissue electron density information).

Regarding the orientation of the phantom 40 inside the MR imaging volume, the phantom(s) can be oriented in any way for the harmonic analysis, as long as the true undistorted coordinates of the sampling points are known.

It should be noted that the 3D distortion field may be predicted in regions exterior to the ROI. For example, a harmonic series expansion that reconstructs the distortion field within the ROI interior may also be evaluated at points exterior to the ROI. This may be advantageous when the phantom size is smaller than the desired region in which the 3D distortion field is to be characterized. However, the reliability and accuracy of the prediction in regions exterior to the ROI generally worsens with increasing distance from the ROI boundary.

Furthermore, in general, there are no restrictions on the shape or geometry of the phantom 40 used in the harmonic analysis as long as the phantom 40 can provide a sampling of the distortion field on the ROI boundary that can be used as the input to the harmonic analysis and obtain data that results in acceptable image correction.

In the various embodiments described herein, in general, the phantom 40 is scanned with a particular imaging sequence, the distortion field is computed via harmonic analysis and the distortion field data are stored. Thereafter, the MRI images of most or all of the subsequent patients scanned with the same or a similar imaging sequence may be corrected for distortions using the distortion field data. MRI images can be corrected automatically for all scans, or on a case-by-case basis at the discretion of a technician or operator.

The MRI image correction method can be performed by a technician as part of a QA procedure (or "calibration stage") on a periodic basis, such as monthly for example, or after MR magnet maintenance (e.g. gradient work, system upgrades, etc.).

It should be noted that the MRI image distortion correction techniques described herein do not need to be performed at an MR scanner, but may be implemented as a module in a treatment planning system (TPS) in some embodiments. In fact, there are numerous ways to apply the image correction techniques described herein.

There are various ways that phantoms and harmonic analysis may be used for image correction as described herein. For example, in some embodiments, the image correction process described herein may be performed using a standalone software application, independent of the software provided by the MR console (manufacturer). Accordingly, in FIG. 1, the link from the phantom 40 to the sampling module 60 may be optional.

Alternatively, in some embodiments, the distortion data that is obtained via the phantom and harmonic analysis, as described herein, may be fed into the MR imaging software which then applies the image correction automatically, as a pre-processing step, for example. The distortion data may be in tabular format. The MR imaging software may then display, via a Graphical User Interface (GUI) and the display 16, the corrected MRI images instead of the raw MRI images (a raw MRI image is an MRI image where no image correction as described herein is applied). In this scenario, the GUI of the MR imaging software can provide an option to allow a user to perform sequence-specific distortion correction, such as but not limited to matching individually stored distortion data sets with a corresponding image sequence, for example. In this case, with reference to FIG. 1, the link from the phantom 40 to the sampling module 60 may be used to feed distortion data back to the operator unit 12 periodically, such as monthly or whenever QA or an update of the distortion field is required, for example.

6. Workflow for Quantification and Correction of MR Image Distortions

Figure 4:
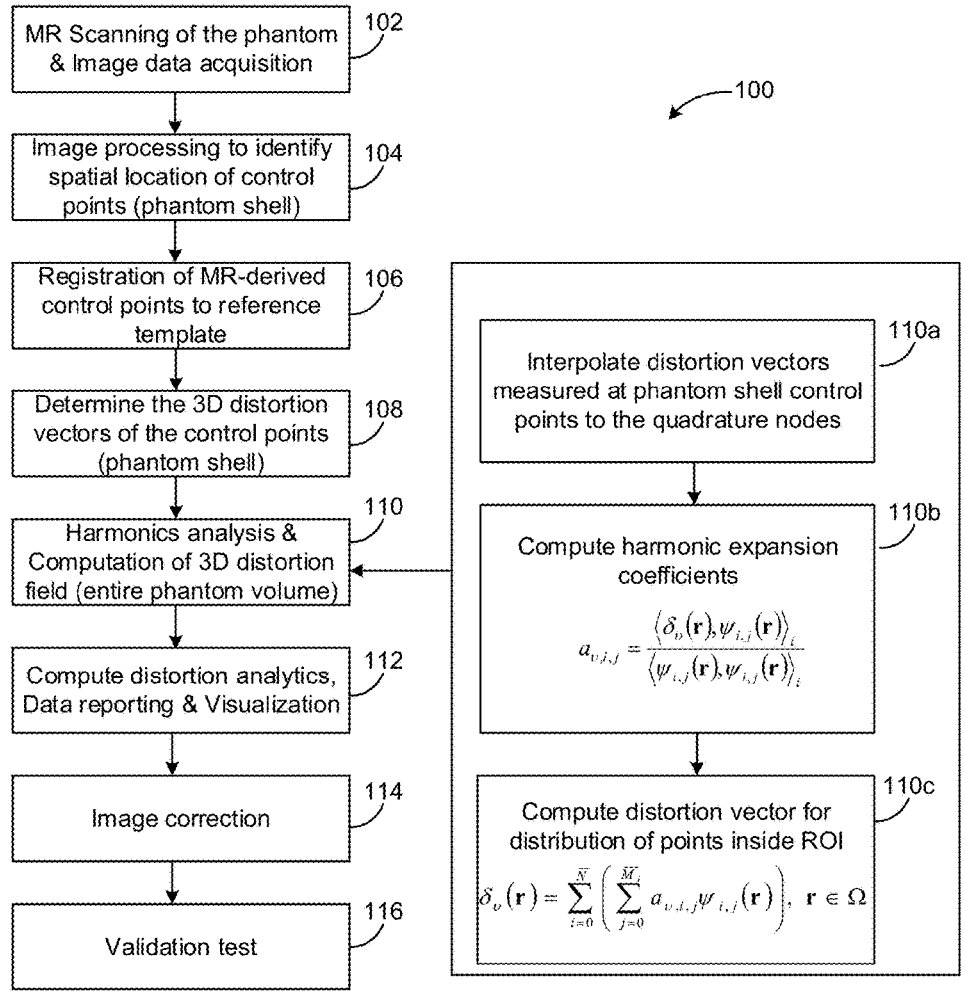
FIG. 4 is a flowchart of an example embodiment of an MR image correction method.

Referring now to FIG. 4, shown therein is a flowchart of an example embodiment of an MR image correction method 100 that can be used for MR image distortion measurement, characterization and correction.

At 102, the method 100 comprises performing MR scanning of the phantom and the resulting image data is obtained via image data acquisition. The phantom 40 is positioned in the MR scanner (e.g. MRI device 42) such that it covers the volume or ROI in which the distortion is intended to be measured. For example, a typical setup is to match the center of the phantom 40 with the isocenter of the MR scanner. The phantom 40 is then scanned with the imaging protocol(s) for which the user requires to quantify the distortions and image data is acquired.

In an alternative embodiment, the phantom 40 can be scanned again, with the same imaging protocol but with certain imaging parameters modified, e.g. reversing the polarity of the read-encode gradient. This permits separating the distortion field into contributions arising from the static polarizing field and the magnetic field gradients. Specifically, these contributions include the distortion due to imperfections in generating the polarizing field and due to local magnetic susceptibility variations in the phantom 40 (or object being imaged) as given by equation 18. Furthermore, the contributions may also include the distortion due to eddy currents and gradient field non-linearities as given by equation 19.

At 104, image processing is performed on the acquired data to identify the spatial location of the control points (i.e. on the boundary of the phantom 40). In general, the methods for identifying the control points are dependent on the design of the phantom 40, i.e. the geometry of the control points. It may be necessary to apply one or more image manipulation steps to the acquired MR images in order to extract the location of the control points. For example, the MR-defined control points can be searched for in pre-defined image regions by applying pixel intensity thresholding followed by a watershed transformation and then determining the spatial coordinates of each control point as the center of a mass of local pixel regions (Stanescu, T., et al., *Investigation of a 3D system distortion correction method for MR images*. J Appl Clin Med Phys, 2010. 11(1): p. 200-216). Other methods might include the use of derivative or summation operators to analyze image pixel values along image columns and/or rows. Subsequently, data profiles are generated to facilitate the depiction of the control points. Another method might be based on characterizing the control points (i.e. sparse or dense sampling) using k-space data.

At 106, registration of the MR-derived located control points to a reference template is performed. The template is derived from a) imaging the phantom with a distortion-free modality such as CT, for example, followed by image processing (see act 104) or b) the manufacturing specifications of the phantom 40 (e.g. computer-aided design (CAD) geometry). The template represents the true location of the control points. The 3D matrix of MR-derived control points is registered into the system of coordinates of a reference template of the phantom 40.

At 108, a first set (i.e. measured set) of 3D distortion vectors corresponding to the control points located at the shell of the phantom 40 are determined. The 3D distortion vectors are given by the difference between the MR-derived located control points and the corresponding reference template coordinates of each control point. Alternatively, the 3D distortion vectors (for control points at the shell of the phantom 40) might be given by combining multiple scans (e.g. having the polarity of the read-encode gradient reversed) to separate the various components (as described for act 102).

At 110, harmonic analysis and computation of a second set (i.e. computed set) of 3D distortion vectors inside a region of interest covered by the phantom 40 is performed. The measured set of measured 3D distortion data is inputted into the harmonic analysis and a harmonic representation of the 3D distortion field that satisfies Laplace's equation is determined. The computed set of 3D distortion vectors is then generated at any location within the region of interest. In an example embodiment, the harmonic analysis process may involve the following acts for the analytical approach:

i. at 110a, interpolation of the measured set of 3D distortion vectors measured at the control points of the phantom 40 to the quadrature nodes is performed when the sampling points are different from the quadrature nodes;

ii. at 110b, computation of the expansion coefficients for the selected harmonic basis functions is done according to the inner product formula $$a_{v,i,j} = \frac{\langle \delta_v(r), \psi_{i,j}(r) \rangle_i}{\langle \psi_{i,j}(r), \psi_{i,j}(r) \rangle_i}$$

for each of the three spatial components of the distortion vector field, which may be accomplished by numerical integration (i.e. quadrature in this example), and the total number of coefficients in the truncated expansion is given by:

$$\sum_{i=0}^{\overline{N}} \overline{M}_i;$$

and iii. at 110c, computation of the three components of the computed set of 3D distortion vectors at a collection of points within the ROI is done according to the harmonic expansion summation formula:

$$\delta_v(r) \approx \sum_{i=0}^{\overline{N}} \left( \sum_{j=0}^{\overline{M}_i} a_{v,i,j} \psi_{i,j}(r) \right),$$

r∈Ω wherein the points can be a select set of points of special interest or may comprise a large array of points that will be stored and subsequently used at a later time to interpolate the distortion field at any arbitrary location within the ROI (it is possible to further truncate the expansion summation by using fewer terms than the number of available expansion coefficients (likely at the cost of decreased accuracy in the distortion reconstruction)).

For the non-analytic approach, numerical methods for solving second-order boundary value problems with arbitrary boundary geometries, or interpolation techniques such as linear regression, may be used for the harmonic analysis as described herein.

At 112, distortion analytics, data reporting and visualization may be computed. Various metrics for quantifying the distortion field globally and locally may be calculated, e.g. at least one of maximum/mean/range of distortions along the x/y/z-directions and the total distortion $$\delta(r) = \sqrt{\delta_x(r)^2 + \delta_y(r)^2 + \delta_z(r)^2}.$$

Other optional metrics may include at least one of the magnitude of the harmonic expansion coefficients, graphical representations of regions of iso-distortion values, regions with distortion magnitudes lower/higher than a pre-defined value and distortion difference maps (between pre-defined values).

At 114, image correction is performed. Firstly, MR images/data for the subject (i.e. patient or phantom) are registered into the system of coordinates of the 3D distortion field (i.e. based on the MR derived control point locations). This is done to ensure the correct alignment of the subject within the distortion field. This act may be achieved by using the spatial localization information stored in the subject's DICOM image header. Secondly, distortion-free images of the subject can be generated by warping pixel (2D) or voxel (3D) image data, e.g. via interpolation techniques such as piecewise, linear, spline, polynomial, Gaussian, multivariate, wavelets. The warping is done to compensate for the distortion vectors that were found during the distortion measurement and characterization using the phantom 40 during act 110 of the method 100.

Alternatively, the method 100 further comprises computing the 3D distributions (i.e. field maps) of the static polarizing field or gradient magnetic fields using the harmonic representation of the 3D distortion field or a computed set of 3D distortion vectors derived from the harmonic analysis. The field maps for the static polarizing field or the gradient magnetic fields computed from the 3D distortion field derived from the harmonic analysis described herein may then be used to directly correct the raw image data in the spatial frequency (i.e. k-space) domain as a pre-processing step prior to image reconstruction.

For example, the discrete samples of the MR signal that are acquired during readout are typically assigned a k-space coordinate based on assumed magnetic field distributions of the static polarizing magnetic field and the gradient magnetic fields. If the true field distributions at the time of imaging differ from the assumed distributions, then the raw data samples may be assigned to incorrect k-space coordinates, resulting in geometric distortion in the reconstructed images. This error can be corrected by using the measured field maps for the static polarizing magnetic field or the gradient magnetic fields to resample the raw image data in the spatial frequency domain so that the discrete samples of the raw MR signal are assigned correct k-space coordinates.

At 116, the validation test may be performed to verify the distortion quantification and correction method by computing the residual distortions, i.e. distortion values computed for a known geometry after applying acts 102 to 114. This can be performed by using a phantom insert (e.g. a coarse grid pattern, object with a known geometry), placed inside a region of the phantom 40 that is absent of any control points (e.g., the center of the cylindrical phantom 40b in FIGS. 3A to 3B). The residual distortion is calculated on the phantom insert by applying acts 102 to 114 of the method 100 for the phantom 40 with the insert. To pass the test, the method 100 should output residual distortion values (i.e. the difference between the known geometry of the insert and the geometry of the insert after applying the harmonic analysis) that are less than the MR image resolution (i.e. less than the image pixel/voxel size).

It should be noted that acts 102 to 116 can be done from time to time in order to determine the distortion data and validate that the image correction based on the distortion data is acceptable. Thereafter, act 114 can be applied to MRI images that are obtained in use on a patient or a subject, for example. Acts 102 to 116 can next be performed for QA monitoring or when some components or parameters of the MRI system 10 have changed.

It should also be noted that acts 114 to 116 are not needed when there is no distortion to correct, such as when a) the actual distortion is too small to affect MRI image quality, or b) the distortion field is determined only for the purpose of monitoring the state of the MR scanner to ensure that the system is stable over time or to report distortion values (e.g. within a certain Field of View (FOV), metrics, etc.).

Furthermore, it should be noted that acts 102 to 116 can be used when testing the validity/robustness of the entire distortion correction method. For example, this can be done in a commercial product when the end user needs to be convinced that the product quality is reliable.

It should also be noted that act 114 can be implemented via multiple options. For example, image correction based on the distortion field data can be integrated into: a) an MR console software, b) a treatment planning system (TPS) where it is used for treatment plan simulation but with the capability for image warping and c) a standalone software application where raw (uncorrected) MRI images are sent to a standalone software platform, by email, a communication network, or DICOM, for example, where image correction is applied to correct for image distortion and then the corrected images are sent to a device or system, such as but not limited to PACS, TPS, or back to the MRI system, for review or further processing.

7. Proof of Concept Harmonic Analysis
7.1. Spherical Region of Interest

In order to validate method 100, a spherical harmonic representation of the distortion field $\delta(r)$ was calculated for a 20 cm diameter spherical region of interest, denoted $\Omega$. A 3D distortion field data set measured with a large phantom was available from a previous study and was considered as a reference for the harmonic analysis. To generate the seed data for the harmonic analysis, the experimental reference data, denoted $\delta'(r)$, was interpolated at a collection of 350 points on the boundary $\partial\Omega$ of $\Omega$ through use of a multi-quadric radial basis function interpolation technique.

Figure 5:
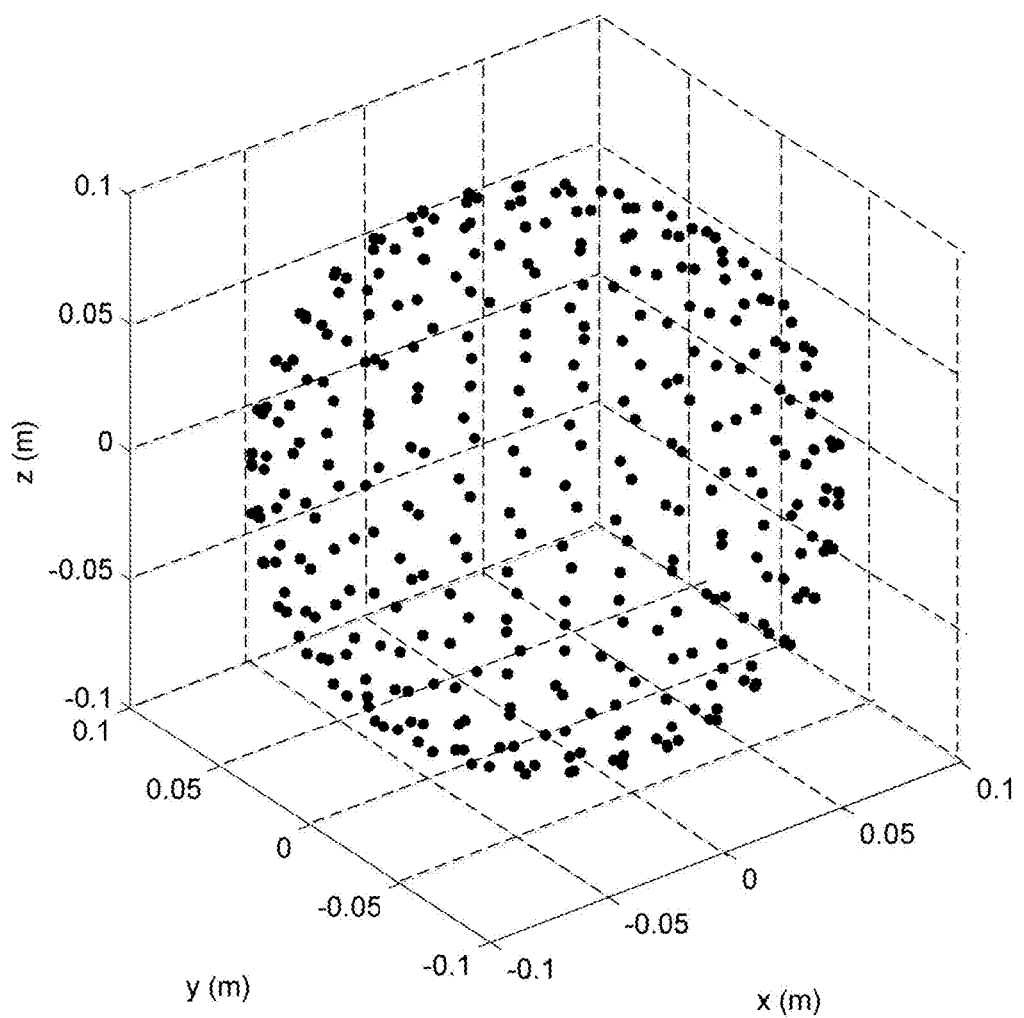
FIG. 5 is a graphical representation of the nodes corresponding to the $31^{st}$ order Lebedev quadrature scheme on the surface of a 20 cm diameter spherical region of interest.
Figure 6A:
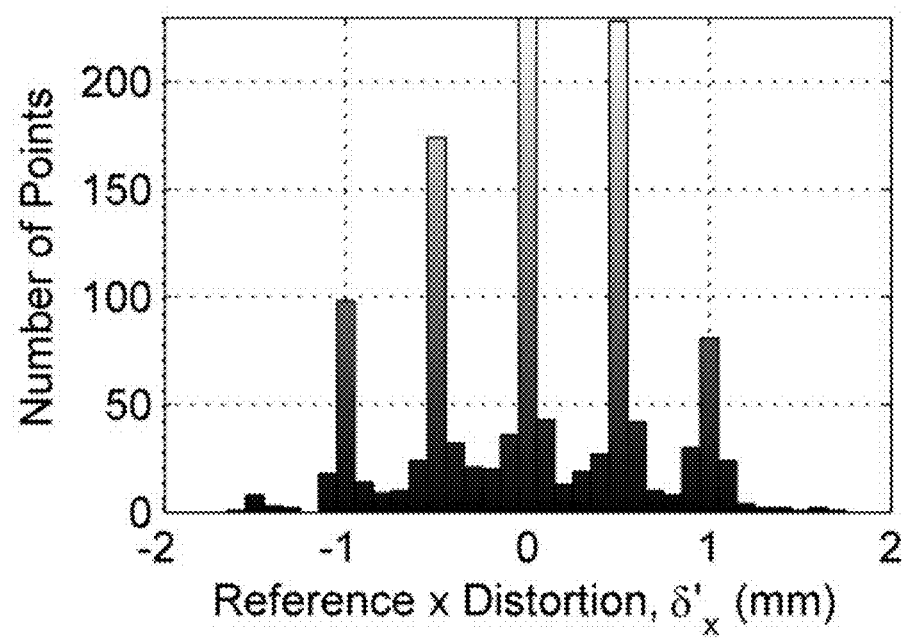
FIGS. 6A to 6H collectively show a histogram comparison of the reference 3D distortion field data $\delta'(r)$ and the residual distortion field $\bar{\delta}(r)$ at 1,237 uniformly distributed points within a 20 cm diameter spherical region of interest.
Figure 6B:
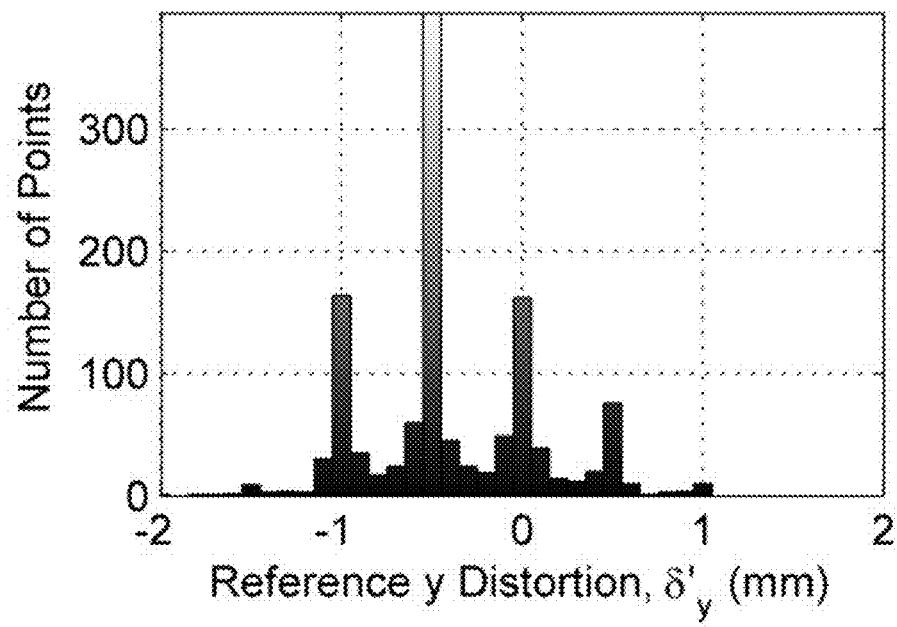
Figure 6C:
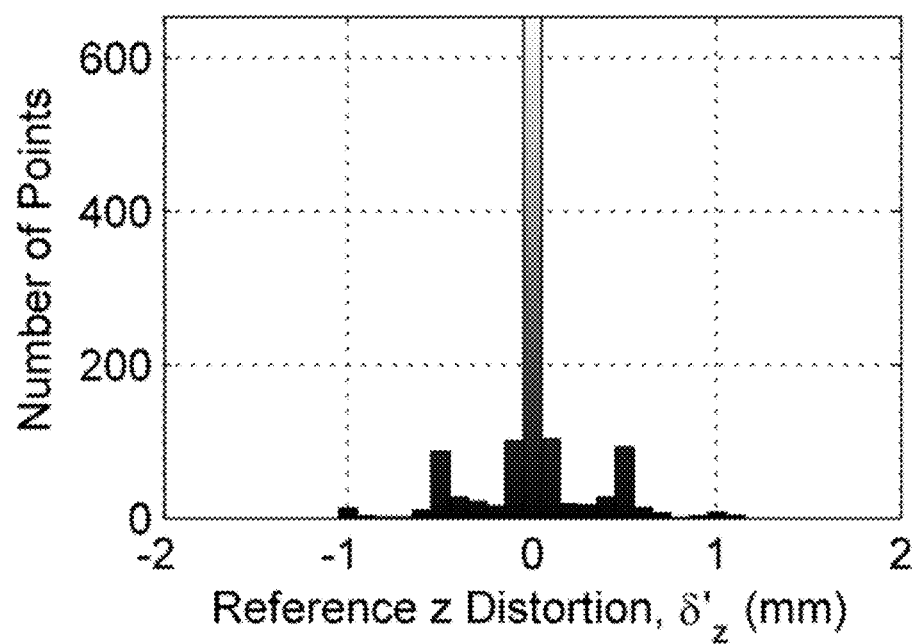
Figure 6D:
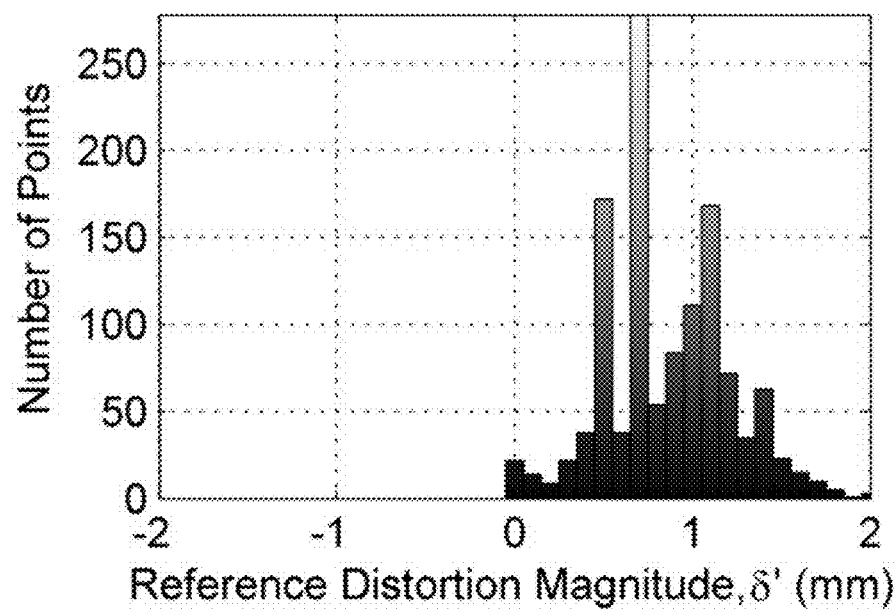
Figure 6E:
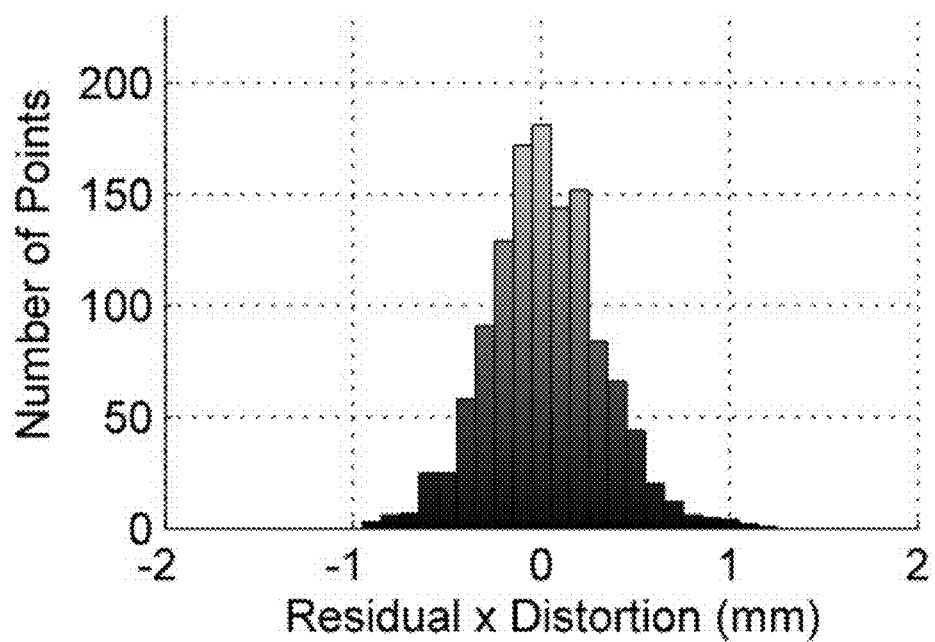
Figure 6F:
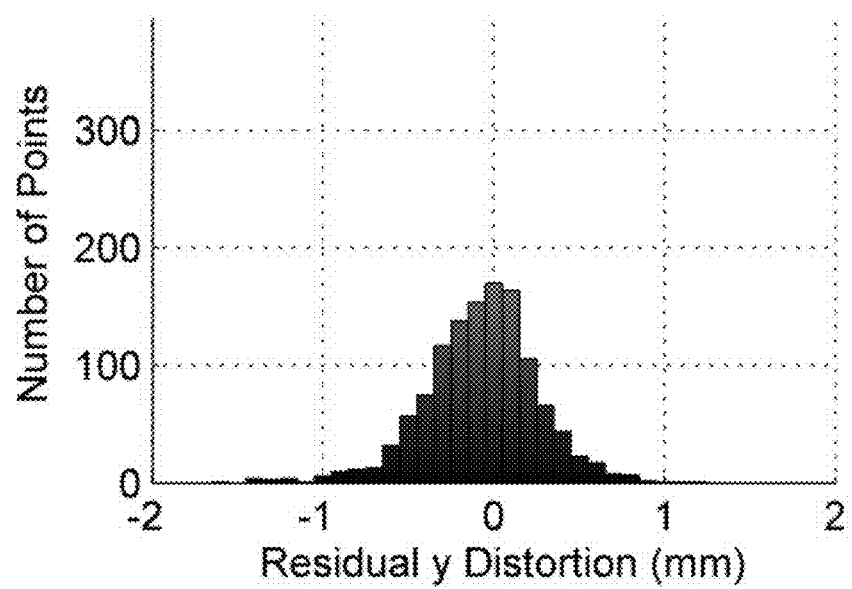
Figure 6G:
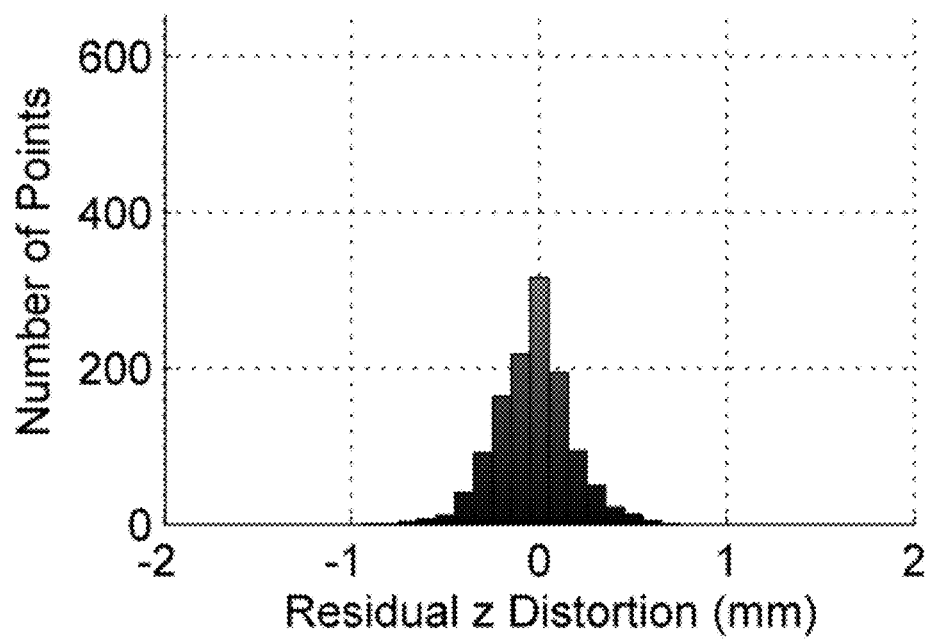
Figure 6H:
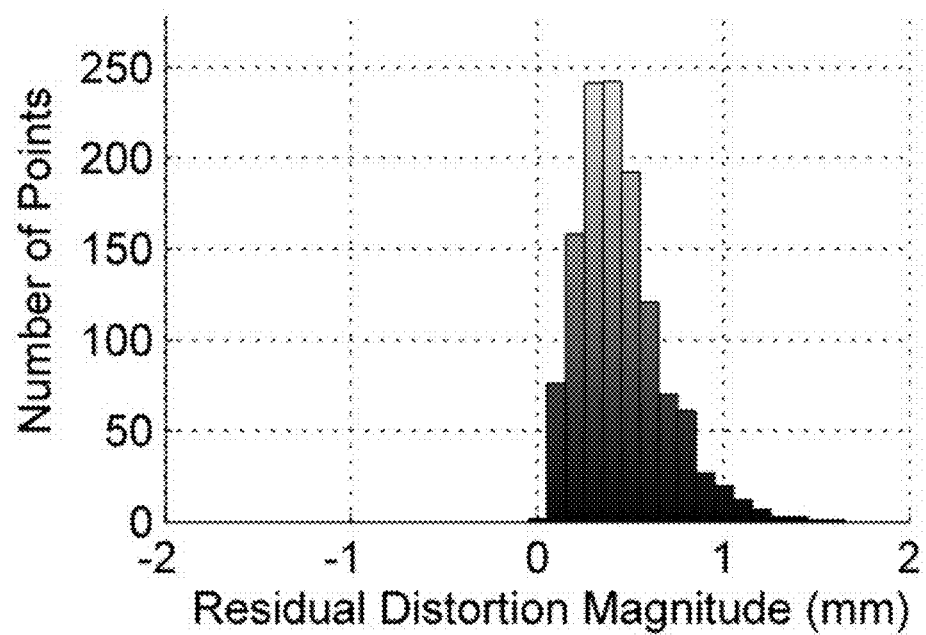

The interpolation points on the surface of a 20 cm diameter spherical region of interest were chosen as the nodes of a $31^{st}$-order Lebedev quadrature scheme (Lebedev, V. I. and D. N. Laikov, *A quadrature formula for the sphere of the* 131*st algebraic order of accuracy*. Doklady Mathematics, 1999. 59(3): p. 477-481) as shown in FIG. 5. The reference distortion values sampled at these nodes were used as the seed data for the spherical harmonic analysis. The coefficients given by equation 38 were then calculated via an integral approximation of the form given in equation 31, up to a maximum order l=13. Given the values of the expansion coefficients, the harmonic representation of the distortion field given by equation 35 was available for reconstructing $\delta(r)$ within $\Omega$.

In alternative embodiments, the interpolation points can be chosen as the nodes of any suitable quadrature scheme. The $31^{st}$ order Lebedev quadrature scheme integrates spherical harmonic functions up to the $31^{st}$ order with exact accuracy, and hence was an appropriate choice in this example.

In particular, $\delta(r)$ was calculated at 1,237 uniformly distributed points within $\Omega$ (i.e. a 20 cm diameter spherical region of interest) and compared to the corresponding measured values $\delta'(r)$ available from the reference 3D distortion field. FIGS. 6A to 6H present a comparison of the reference distortion field $\delta'(r)$ and the residual distortion vector $\tilde{\delta}=\delta(r)-\delta'(r)$, in which histograms of the individual vector components and the total vector magnitudes of these fields have been plotted for $\Omega$. The distortion values are shown in units of mm. As is evident in FIGS. 6A-6H, the discrepancy $\tilde{\delta}(r)$ between the reference and the reconstructed distortion fields is small. Specifically, for 97% of the 1,237 points within $\Omega$, the individual vector components and total vector magnitudes for $\delta(r)$ and $\delta'(r)$ agree to within 1 mm.

7.2. Cylindrical Region of Interest

Figure 7A:
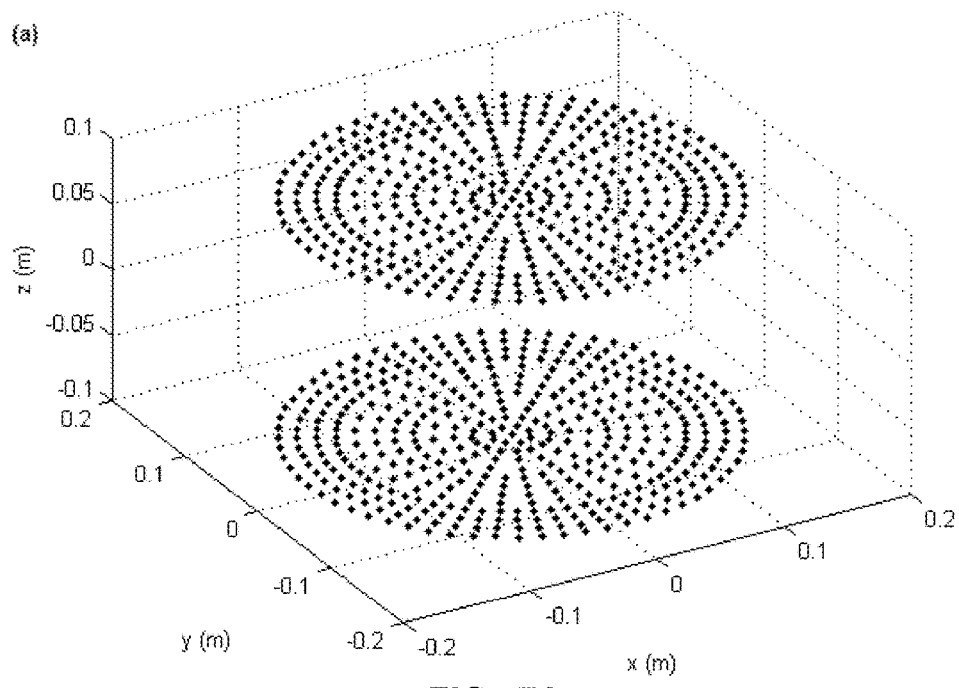
FIG. 7A shows a graphical representation of the nodes corresponding to a quadrature scheme on the circular end surfaces of a cylindrical region of interest that is 32 cm in diameter and 18 cm in axial length.
Figure 7B:
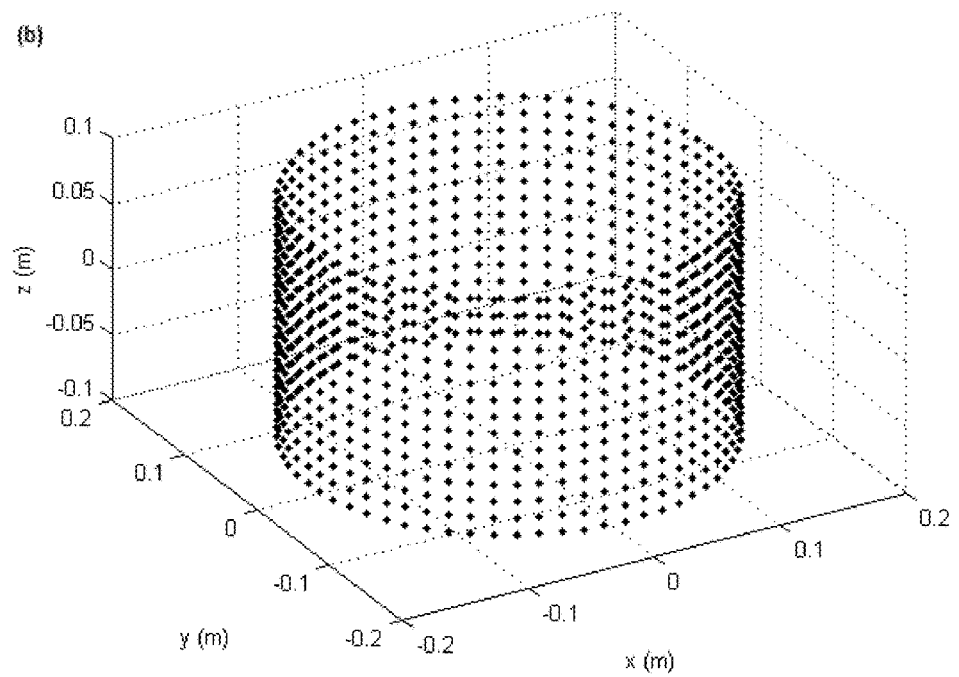
FIG. 7B shows a graphical representation of the nodes corresponding to a quadrature scheme on the circular curved lateral surfaces of a cylindrical region of interest that is 32 cm in diameter and 18 cm in axial length.
Figure 8A:
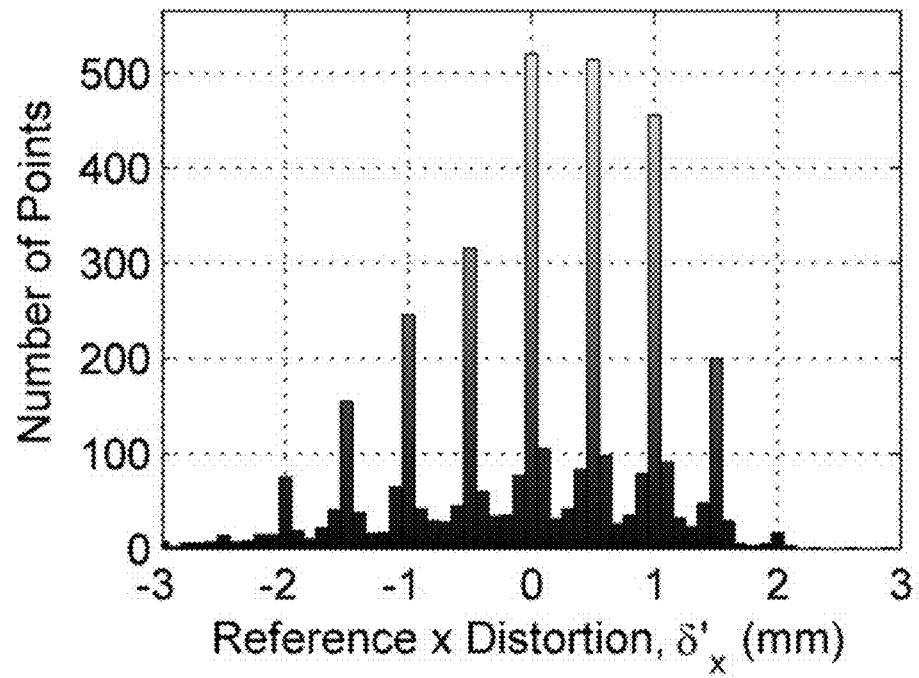
FIGS. 8A to 8H show a histogram comparison of the reference 3D distortion field data $\delta'(r)$ and the residual distortion field $\bar{\delta}(r)$ at 3,927 uniformly distributed points within a cylindrical region of interest that is 32 cm in diameter and 18 cm in axial length.
Figure 8B:
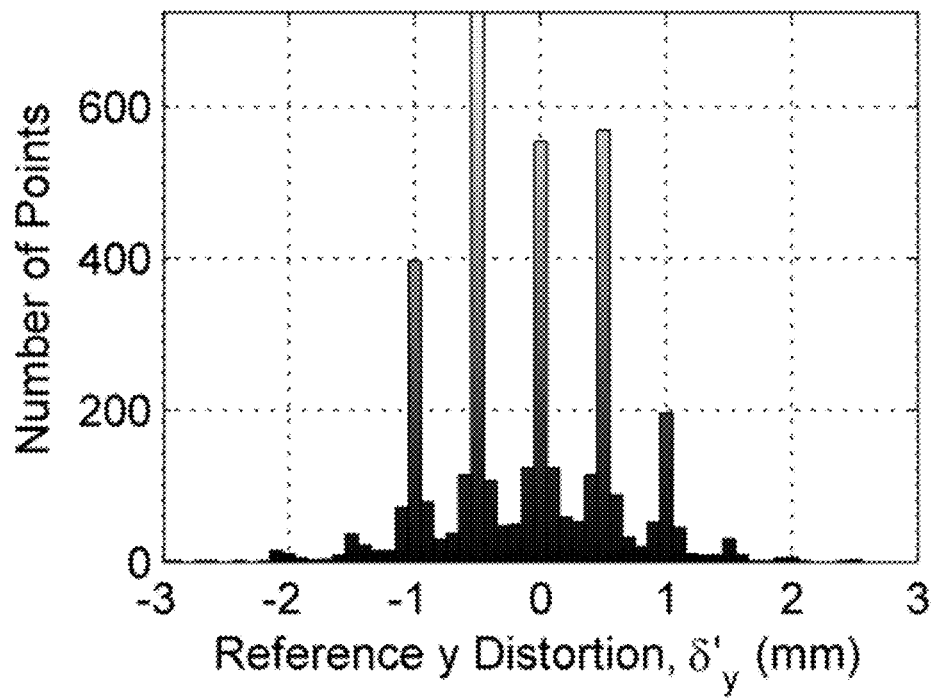
Figure 8C:
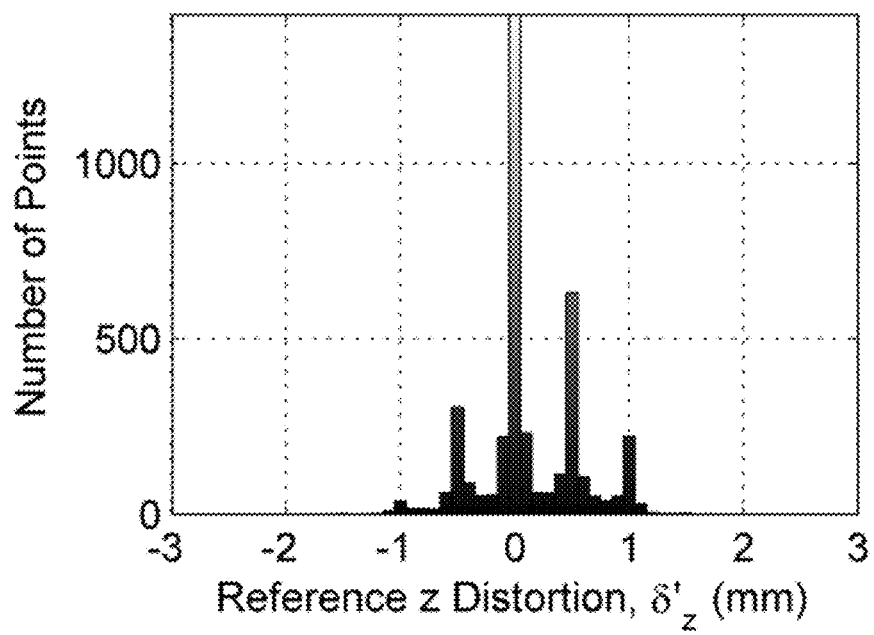
Figure 8D:
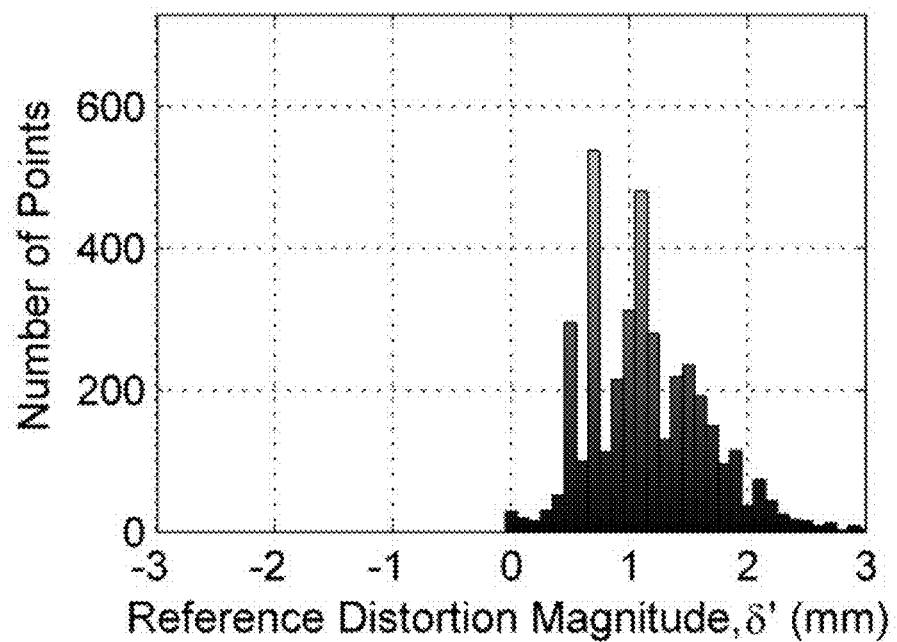
Figure 8E:
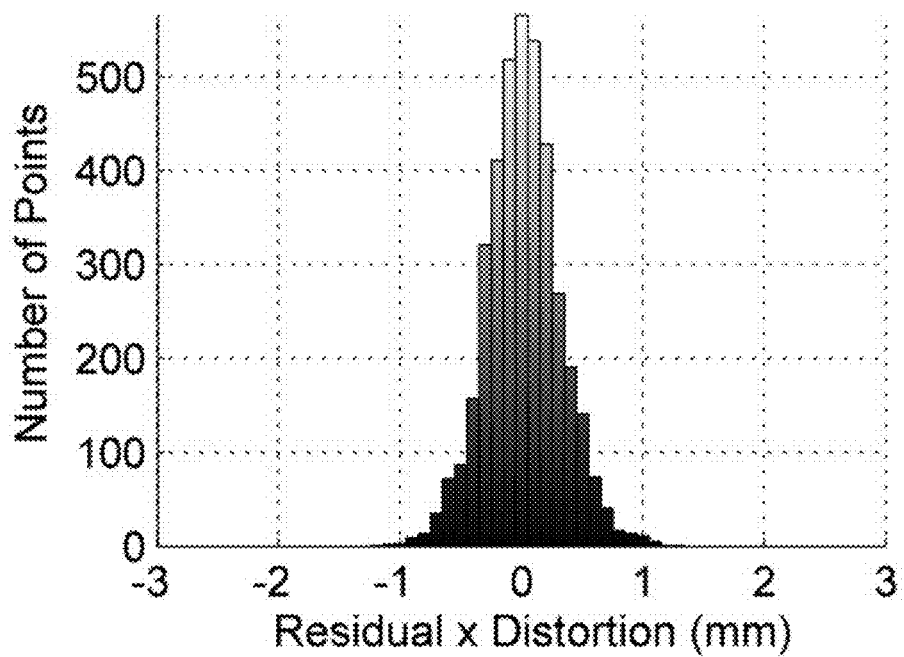
Figure 8F:
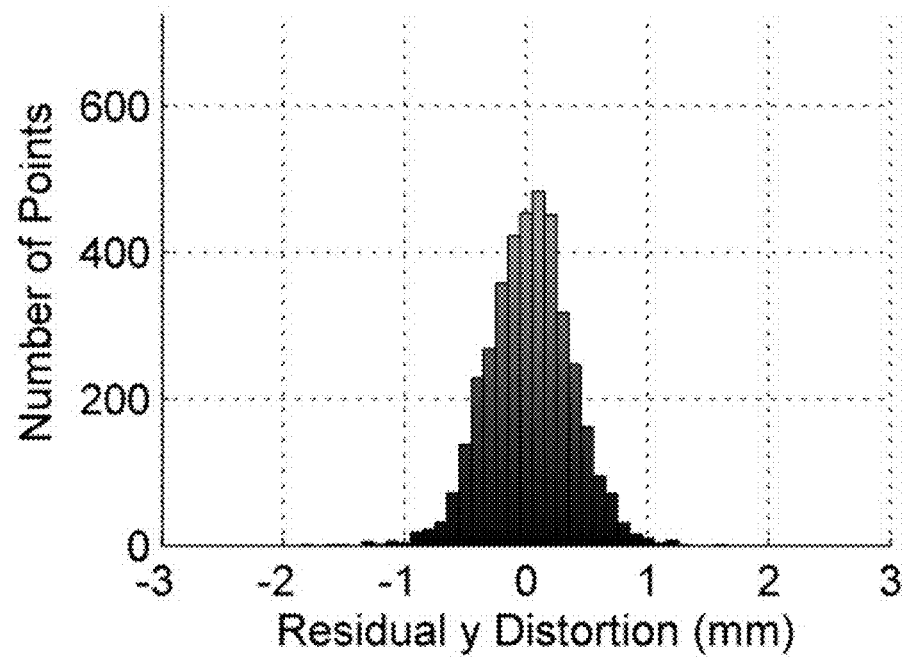
Figure 8G:
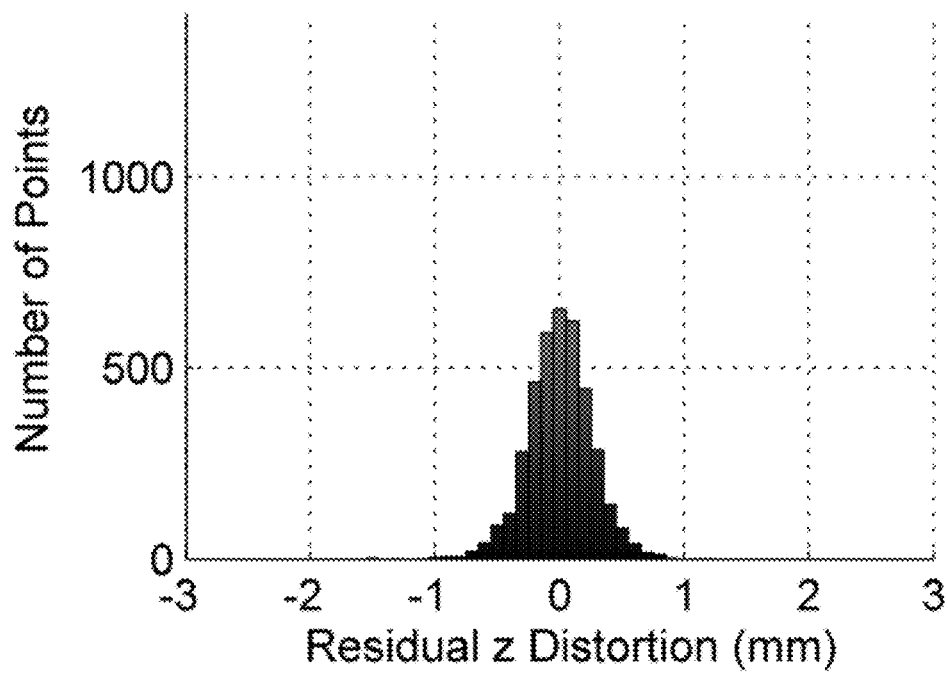
Figure 8H:
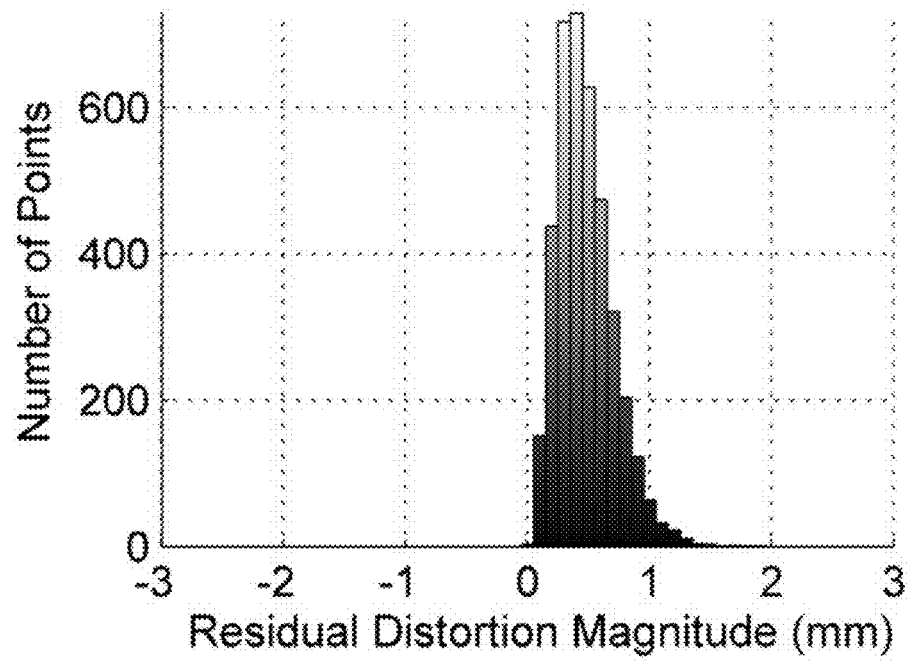

As another example validation of the method 100, a cylindrical harmonic representation of the distortion field $\delta(r)$ was calculated for a cylindrical ROI, denoted $\Omega_2$, which is 32 cm in diameter, 18 cm in axial length, and centered at the isocenter. As for the spherical phantom, the reference distortion data $\delta'(r)$ was interpolated at a collection of 1,976 points on the boundary $\partial\Omega_2$ of $\Omega_2$. In particular, 444 interpolation points were distributed on each of the circular end surfaces in accordance with a Simpson quadrature scheme, with the remaining 960 points distributed on the lateral curved surface according to a hybrid Simpson-Gaussian quadrature scheme (Stroud, A. H., *Approximate Calculation of Multiple Integrals* 1971, New Jersey: Prentice-Hall) as shown in FIGS. 7A and 7B respectively. The reference distortion values sampled at these nodes were used as the seed data for the cylindrical harmonic analysis. The coefficients given by equation 44 were then calculated via an integral approximation of the form given in equation 31, up to maximum orders of l=6 and m=8. It may be possible to use other orders in other embodiments. Given the values of the expansion coefficients, the harmonic representation of the distortion field given by equation 42 was available for reconstructing $\delta(r)$ within $\Omega$.

For example, the distortion field $\delta(r)$ was calculated at 3,927 uniformly distributed points within $\Omega_2$ and compared to the corresponding measured values $\delta'(r)$ available from the reference 3D distortion field. FIGS. 8A to 8H present a comparison of the reference 3D distortion field $\delta'(r)$ and the residual distortion vector $\tilde{\delta}(r)=\delta(r)-\delta'(r)$, in which histograms of the individual vector components and the total vector magnitudes of these fields have been plotted. The discrepancy $\tilde{\delta}(r)$ between the reference and reconstructed distortion fields is small, with the individual vector components and total vector magnitudes for $\delta(r)$ and $\delta'(r)$ agreeing to within 1 mm for 97% of the 3,927 points within $\Omega_2$.

8. Application for MR Shimming and Gradient System Optimization

The method 100 and any alternative embodiments thereof described herein can also be applied (with minimal modifications) for the shimming of the MR imaging field. Given that the distortions resulting from static field inhomogeneities, gradient non-linearities, or eddy currents, can all be reconstructed using the method 100 and any alternative embodiments thereof described herein, then any improvements/modifications to the MRI system 10 that are made based on this information are relevant.

Figure 9:
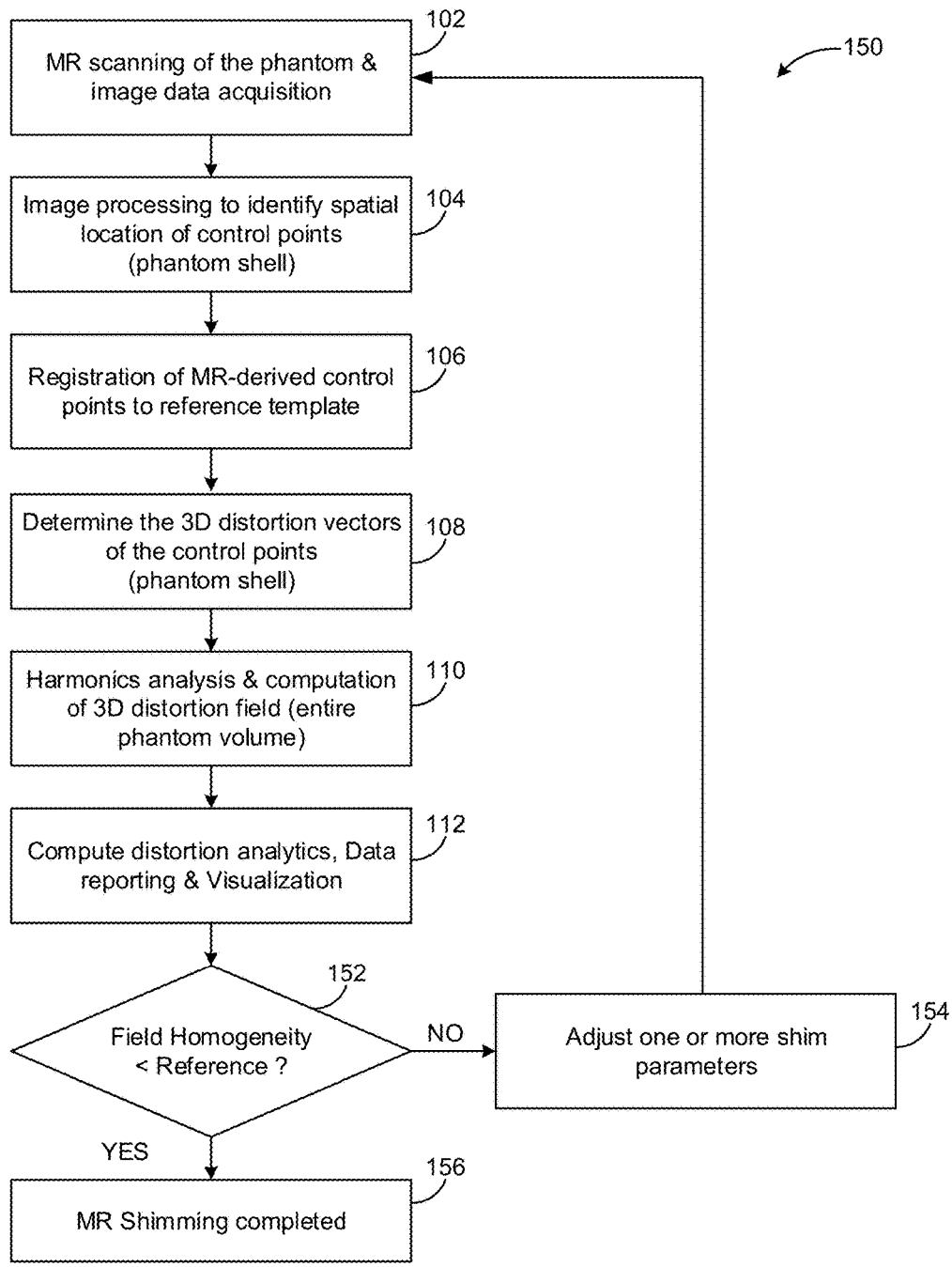
FIG. 9 is a flowchart of an example embodiment of an MR shimming method.

For example, it is possible for the reconstructed distortion map, due to static field inhomogeneities, to guide any MR shimming process. A flowchart of an example embodiment of an MR shimming method 150 is shown in FIG. 9. The method 150 is similar to the method 100 (see FIG. 4) except that the image correction at 114 and the validation at 116 are replaced with an iterative process 152 and 154 in which the phantom 40 is scanned repeatedly to measure the imaging field characteristics (i.e. geometric distortion or homogeneity) which may be determined at 112 and at each iteration, one or more design parameters (e.g. shim coil currents, ferromagnetic shim positions/sizes, etc.) are repeatedly adjusted in order to achieve a desired level of field homogeneity (or distortion), which is evaluated via harmonic analysis. In this example embodiment, at 112, the distortion analysis is performed to obtain a snapshot of the current field homogeneity. Specifically, a measure of the geometric distortion (e.g. the maximum distortion within the imaging volume, or the magnitudes of a particular subset of expansion coefficients describing the distortion field, etc.) may be used as a surrogate for the magnitude or character of the field nonuniformity. Furthermore, the distortion map may be converted into a field nonuniformity map, based on equation 18. Then, if the homogeneity/distortion is not acceptable, as determined at step 152, the system/shim configuration may be modified. Once the shimming process is completed, any residual distortions of the actual MRI images, which may arise from imperfect shimming and/or other sources as described in the background section, may undergo unwarping/correction.

As another example, the reconstructed distortion map due to gradient field nonlinearities can be used to guide the design or positioning of the gradient coils.

As yet another example, the reconstructed distortion map due to gradient nonlinearities (without pre-emphasis filtering) can be used to guide the design of optimized pre-emphasis filters (or any other system components that mitigates eddy currents and their detrimental effects).

In all of these additional applications, one approach may involve an iterative adjustment of one or more design parameters (e.g. gradient coil positions, pre-emphasis filter parameters, etc.) to minimize the distortion magnitude (according to some objective metric/measure). The methods that can be used for these additional applications are similar to the method 150.

The various embodiments of the methods and systems described herein for MRI image correction or MRI shimming generally do not require any prior knowledge of the field strength distribution of the MR static polarizing or imaging gradient magnetic fields. Instead, a direct measurement of the geometric distortion on the boundary of a pre-defined ROI may be used. Furthermore, the harmonic analysis and reconstruction of the 3D distortion field is independent of the method used to acquire the distortion measurement on the ROI boundary.

The various embodiments of the methods and systems described herein for MRI image correction may correct images for distortions arising from at least one of imaging gradient nonlinearities, magnetic field contaminants generated by eddy currents, and non-uniformities in the static polarizing magnetic field ($B_0$).

Furthermore, the various embodiments of the methods and systems described herein may also correct the geometric distortion arising from any other sources for which the contribution to the geometric distortion can be mathematically expressed as (or approximated by) a linear combination of harmonic functions.

It should be understood that in order to perform the method, since only knowledge of the distortion field on the boundary of the ROI within which the 3D distortion map is to be calculated is needed, the requirement of any sampling points within the interior of the ROI and associated phantom is eliminated. Consequently, the interior of the phantom 40 may instead be used to house additional phantom modules and devices tailored for other purposes (e.g., at least one of MR image quality, dosimetry for MR-guided radiotherapy systems, calibration of MR-guided Focused Ultrasound systems, and the like). Therefore, it is possible to design and build a phantom that would allow for multiple tests to be performed with a single acquisition scan, which is a radical improvement over conventional methods which rely on the use of several phantoms for performing multiple tests.

Another feature of the embodiments described herein is reduced computation and faster execution since once the distortion map within the ROI has been calculated via the harmonic analysis, the corrected coordinates may be derived from the uncorrected coordinates in a single step. No further analysis (e.g. involving iterative methods or solving a system of non-linear equations) is required.

In addition, it has been found that the embodiments described herein are robust against uncertainty in the distortion field measurements on the ROI boundary. That is, via adequate sampling of the boundary data, the error in the calculated distortion within the ROI interior may be driven less than that of the directly measured distortion on the ROI boundary.

In practice, physical control points can be manufactured to sit anywhere along the shell of the phantom. In other words, the location of the control points need not be limited to the surface of the shell of the phantom as the control points can be located on an outer surface of the shell of the phantom, on an inner surface of the shell of the phantom, embedded within the layer of material that forms the shell of the phantom or embedded at other locations within the phantom. The placement of the control points may be determined by the manufacturing approach used to manufacture the phantom and the manufacturing approach that may be used could be the one that is most cost-effective or it may depend on any combination of other factors such as, but not limited to, at least one of the size of the phantom, the mechanical integrity of the phantom or the dimension of the control points needed to provide enough signal strength in the MR images, for example. There can be other factors as well.

Accordingly, it should be understood that the phrase "control points associated with at least a portion of the phantom" is meant to cover control points that are located on at least a portion of an outer surface of the shell of the phantom, on at least a portion of an inner surface of the shell of the phantom, embedded within at least a portion of the shell of the phantom or embedded at other locations within the phantom.

It should also be understood that at least some of the elements of the MRI system 10 that are implemented via software may be written in a high-level procedural language such as object oriented programming or a scripting language. Accordingly, the program code may be written in at least one of C, $C^{++}$, SQL or any other suitable programming language and may comprise modules or classes, as is known to those skilled in object oriented programming. It should also be understood that at least some of the elements of the MRI system 10 that are implemented via software may be written in at least one of assembly language, machine language or firmware as needed. In either case, the program code can be stored on a storage media or on a computer readable medium that bears computer usable instructions for one or more processors and is readable by a general or special purpose programmable computing device having at least one processor, an operating system and the associated hardware and software that is necessary to implement the functionality of at least one of the embodiments described herein. The program code, when read by the computing device, configures the computing device to operate in a new, specific and predefined manner in order to perform at least one of the methods described herein.

Furthermore, the computer readable medium may be provided in various non-transitory forms such as, but not limited to, one or more diskettes, compact disks, tapes, chips, USB keys, magnetic and electronic storage media and external hard drives or in various transitory forms such as, but not limited to, wire-line transmissions, satellite transmissions, internet transmissions or downloads, digital and analog signals, and the like. The computer useable instructions may also be in various forms, including compiled and non-compiled code.

While the applicant's teachings described herein are in conjunction with various embodiments for illustrative purposes, it is not intended that the applicant's teachings be limited to such embodiments. On the contrary, the applicant's teachings described and illustrated herein encompass various alternatives, modifications, and equivalents, without generally departing from the embodiments described herein.

The invention claimed is:

1. A method for the measurement and characterization of geometric distortions in images obtained using magnetic resonance, the method comprising:
   acquiring image data from an MR scan of a phantom using an imaging protocol, the phantom being placed inside a volume requiring quantification of geometric distortion;
   identifying spatial locations of control points associated with at least a portion of the phantom;
   registering the located control points to a reference template of the phantom;
   determining a measured set of 3D distortion vectors for the located control points of the phantom using the reference template;
   deriving a computed set of 3D distortion vectors from the measured set of 3D distortion vectors for a set of points within a region of interest covered by the phantom by using harmonic analysis; and
   evaluating a harmonic series expansion from the harmonic analysis at points outside of the region of interest when the phantom has a size that is smaller than a desired region for which a 3D distortion field is characterized.

2. The method of claim 1, wherein the method comprising correcting for geometric distortion arising from any other sources whose contribution to the geometric distortion is mathematically expressed as a linear combination of harmonic functions.

3. The method of claim 1, wherein the method comprises providing the phantom with a hybrid shape having a central region with a spherical or cylindrical structure and extension regions beyond the central region, the extension regions comprising a different geometric configuration.

4. The method of claim 3, wherein the phantom extension region comprises a 2D/3D grid, contour lines with predefined patterns or an arbitrary 2D/3D distribution of structural features that is used to quantify geometric distortions in MR images.

5. The method of claim 1, wherein the method further comprises performing image correction using the 3D distortion field comprising the computed set of 3D distortion vectors.

6. The method of claim 1, wherein the method further comprises performing at least one additional MR scan of the phantom to separate the 3D distortion field into contributions from a static polarizing field and magnetic field gradients.

7. The method of claim 1, wherein the reference template is generated from manufacturing specifications of the phantom or by imaging the phantom with a distortion-free modality.

8. The method of claim 1, wherein the 3D distortion field is defined as a difference between the located control points and corresponding template coordinates of each located control point from the reference template.

9. The method of claim 1, wherein the harmonic analysis comprises interpolating the measured set of 3D distortion vectors measured at the control points of the phantom to quadrature nodes; computing harmonic expansion coefficients for selected harmonic basis functions using an inner product formula for each of three spatial components of the 3D distortion field; and computing three components of the computed set of 3D distortion vectors at a collection of points within the region of interest according to a harmonic expansion summation formula.

10. An operator unit for the measurement and characterization of geometric distortions in images obtained using magnetic resonance, the operator unit comprising:
    an interface unit coupled to an imaging device to allow control signals to be sent to the imaging device and to receive data from the imaging device including imaging data; and
    a processing unit for controlling the operator unit and the imaging device and for determining geometric distortion in the image data received from the imaging device, the processing unit being configured to acquire image data from an MR scan of a phantom using an imaging protocol, the phantom being placed inside a volume requiring quantification of geometric distortion; to identify spatial locations of control points associated with at least a portion of the phantom; to register the located control points to a reference template of the phantom; to determine a measured set of 3D distortion vectors for the located control points of the phantom using the reference template; to derive a computed set of 3D distortion vectors from the measured set of 3D distortion vectors for a set of points within a region of interest covered by the phantom by using harmonic analysis; and to evaluate a harmonic series expansion from the harmonic analysis at points outside of the region of interest when the phantom has a size that is smaller than a desired region for which a 3D distortion field is characterized.

11. The operator unit of claim 10, wherein the processing unit is further configured to perform correction for geometric distortion arising from any other sources whose contribution to the geometric distortion is mathematically expressed as a linear combination of harmonic functions.

12. The operator unit of claim 10, wherein the phantom comprises a hybrid shape having a central region with a spherical or cylindrical structure and extension regions beyond the central region, the extension regions comprising a different geometric configuration.

13. The operator unit of claim 12, wherein the phantom extension region comprises a 2D/3D grid, contour lines with pre-defined patterns or an arbitrary 2D/3D distribution of structural features that is used to quantify geometric distortions in MR images.

14. The operator unit of claim 10, wherein the processing unit is further configured to perform image correction using the 3D distortion field comprising the computed set of 3D distortion vectors.

15. The operator unit of claim 10, wherein the processing unit is further configured to perform at least one additional MR scan of the phantom to separate the 3D distortion field into contributions from a static polarizing field and magnetic field gradients.

16. The operator unit of claim 10, wherein the 3D distortion field is defined as a difference between the located control points and corresponding template coordinates of each located control point from the reference template.

17. The operator unit of claim 10, wherein processing unit is configured to perform the harmonic analysis by interpolating the measured set of 3D distortion vectors measured at the control points of the phantom to quadrature nodes; computing harmonic expansion coefficients for selected harmonic basis functions using an inner product formula for each of three spatial components of the 3D distortion field; and computing three components of the computed set of 3D distortion vectors at a collection of points within the region of interest according to a harmonic expansion summation formula.

* * * * *